(12) United States Patent
Kuo et al.

(10) Patent No.: US 12,469,807 B2
(45) Date of Patent: Nov. 11, 2025

(54) FAN-OUT PACKAGE STRUCTURES WITH CASCADED OPENINGS IN ENHANCEMENT LAYER

(71) Applicant: Taiwan Semiconductor Manufacturing Company, Ltd., Hsinchu (TW)

(72) Inventors: Ting-Ting Kuo, Hsinchu (TW); Li-Hsien Huang, Hsinchu (TW); Tien-Chung Yang, Hsinchu (TW); Yao-Chun Chuang, Hsinchu (TW); Yinlung Lu, Hsinchu (TW); Jun He, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 598 days.

(21) Appl. No.: 17/814,836

(22) Filed: Jul. 26, 2022

(65) Prior Publication Data
US 2024/0038701 A1 Feb. 1, 2024

(51) Int. Cl.
*H01L 23/00* (2006.01)
*H01L 23/31* (2006.01)
(Continued)

(52) U.S. Cl.
CPC .......... *H01L 24/08* (2013.01); *H01L 23/3128* (2013.01); *H01L 23/49816* (2013.01);
(Continued)

(58) Field of Classification Search
CPC ................. H01L 24/08; H01L 23/3128; H01L 23/49816; H01L 23/5226; H01L 23/5286;
(Continued)

(56) References Cited

U.S. PATENT DOCUMENTS 8,222,538 B1* 7/2012 Yoshida ................. H05K 1/184
174/262
2003/0134450 A1* 7/2003 Lee .......................... H01L 25/50
257/E21.705
(Continued)

FOREIGN PATENT DOCUMENTS

TW 202040786 A 11/2020
TW 202117956 A 5/2021
(Continued)

*Primary Examiner* — Fernando L Toledo
*Assistant Examiner* — Neil R Prasad
(74) *Attorney, Agent, or Firm* — KILPATRICK TOWNSEND & STOCKTON LLP

(57) ABSTRACT

A semiconductor package structure is provided. The semiconductor package structure includes: a die having a frontside and a backside; a first redistribution layer (RDL) structure disposed on the backside of the die; a second RDL structure disposed on and electrically connected to the frontside of the die; a through integrated fan-out via (TIV) disposed lateral to the die and extending to electrically connect the first and the second RDL structures; a molding compound disposed between the first and second RDL structures; an enhancement layer disposed on the second RDL structure; a plurality of pre-solder bumps; and a plurality of solder balls disposed on and electrically connected to the second RDL structure. The enhancement layer
(Continued)

includes a plurality of cascaded openings electrically connected to the first RDL structure. Each of the pre-solder bumps is disposed in one of the cascaded openings.

20 Claims, 19 Drawing Sheets

(51) Int. Cl.
  *H01L 23/498* (2006.01)
  *H01L 23/522* (2006.01)
  *H01L 23/528* (2006.01)
  *H01L 23/538* (2006.01)

(52) U.S. Cl.
  CPC ...... *H01L 23/5226* (2013.01); *H01L 23/5286* (2013.01); *H01L 23/5389* (2013.01); *H01L 24/14* (2013.01); *H01L 24/19* (2013.01); *H01L 24/73* (2013.01); *H01L 2224/02379* (2013.01); *H01L 2224/12105* (2013.01); *H01L 2924/15311* (2013.01)

(58) Field of Classification Search
  CPC ..... H01L 23/5389; H01L 24/14; H01L 24/19; H01L 24/73; H01L 2224/02379; H01L 2224/12105; H01L 2924/15311
  See application file for complete search history.

(56) References Cited

U.S. PATENT DOCUMENTS

| | | | |
|---|---|---|---|
| 2005/0258540 A1* | 11/2005 | Minda | H01L 24/13 257/E23.021 |
| 2013/0320525 A1* | 12/2013 | Lin | H01L 24/19 257/737 |
| 2015/0243633 A1* | 8/2015 | Chen | H01L 21/76898 257/774 |
| 2016/0027764 A1* | 1/2016 | Kim | H01L 25/105 257/686 |
| 2020/0152608 A1* | 5/2020 | Hu | H01L 24/20 |
| 2020/0266143 A1 | 8/2020 | Liao et al. | |
| 2021/0313261 A1 | 10/2021 | Liao et al. | |
| 2021/0367324 A1 | 11/2021 | Kuo et al. | |
| 2022/0223534 A1 | 7/2022 | Lin et al. | |
| 2023/0197679 A1* | 6/2023 | Ecton | H01L 24/73 257/668 |

FOREIGN PATENT DOCUMENTS

| | | |
|---|---|---|
| TW | 202125746 A | 7/2021 |
| TW | 202207408 A | 2/2022 |
| TW | 202220098 A | 5/2022 |
| TW | 202228256 A | 7/2022 |

* cited by examiner

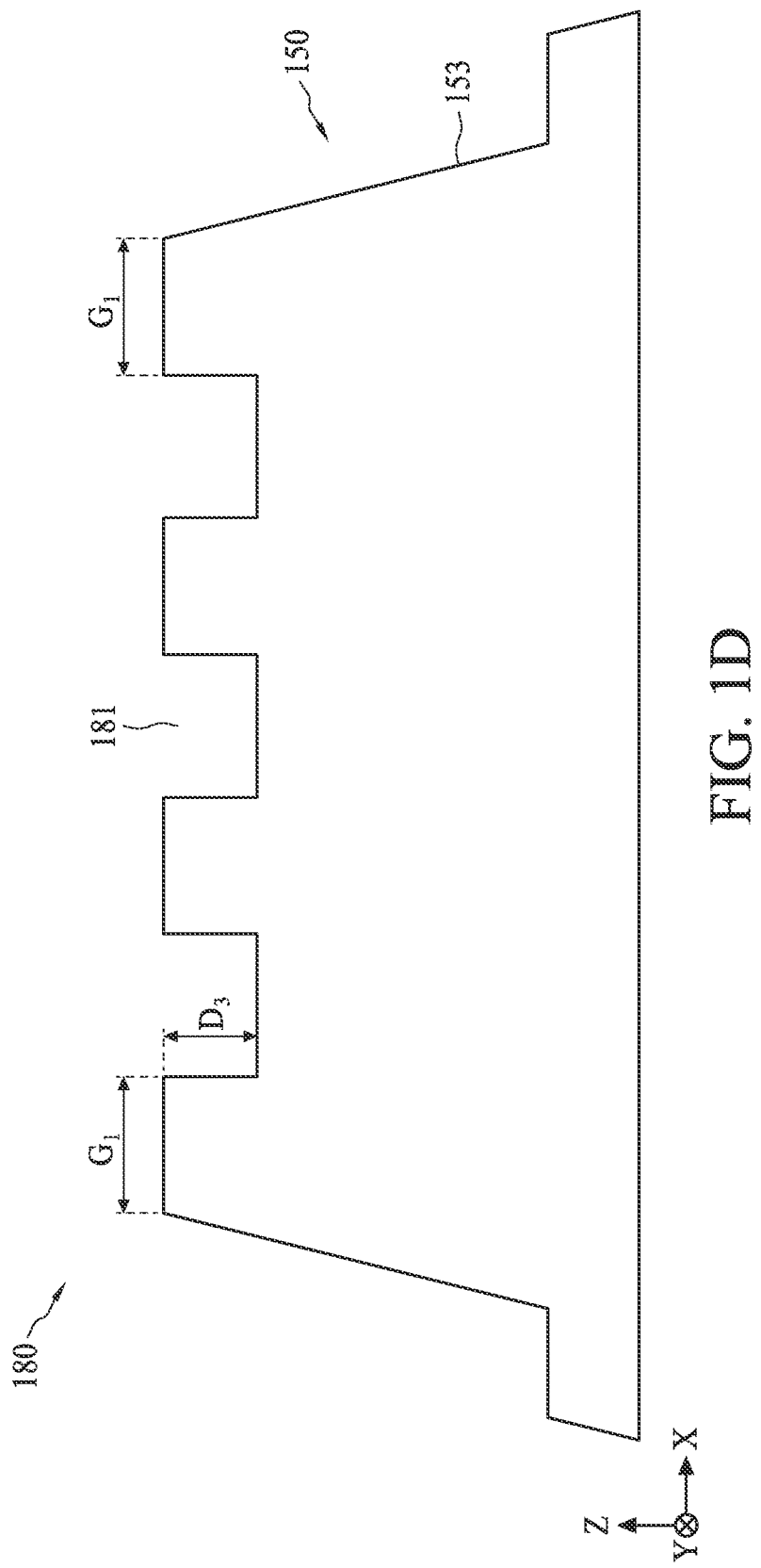

FAN-OUT PACKAGE STRUCTURES WITH CASCADED OPENINGS IN ENHANCEMENT LAYER

FIELD

Embodiments of the present disclosure relate generally to semiconductor packaging, and more particular to integrated fan-out (InFO) packages.

BACKGROUND

In recent years, the semiconductor industry has experienced rapid growth due to continuous improvement in the integration density of a variety of electronic components (e.g., transistors, diodes, resistors, capacitors, etc.). For the most part, improvement in integration density has resulted from iterative reduction of minimum feature size, which allows more components to be integrated into a given area.

These continuously scaled electronic components require smaller packages that occupy less area than previous packages. Exemplary types of packages include quad flat pack (QFP), pin grid array (PGA), ball grid array (BGA), flip chips (FC), three-dimensional integrated circuits (3D ICs), wafer-level packages (WLPs), and package on package (PoP) devices. However, there are quite a few challenges to be handled for the technologies of advanced packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1D is an enlarged cross-sectional view of an example laser marking region of the semiconductor package shown in FIG. 1A in accordance with some embodiments.

DETAILED DESCRIPTION OF THE DISCLOSURE

Figure 1A:
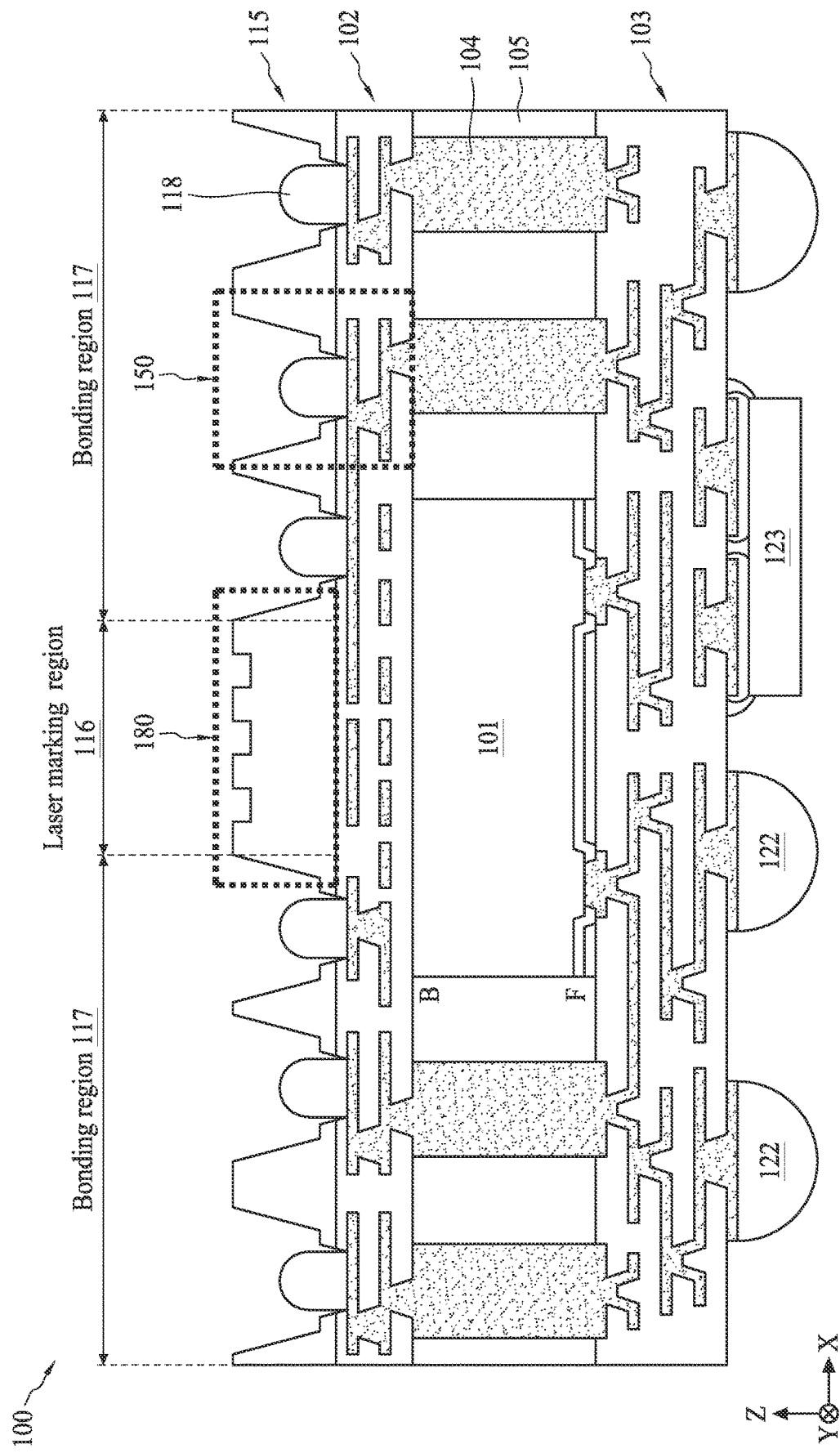
FIG. 1A is a schematic cross-sectional view of an example semiconductor package structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, source/drain region(s) may refer to a source or a drain, individually or collectively dependent upon the context. For example, a device may include a first source/drain region and a second source/drain region, among other components. The first source/drain region may be a source region, whereas the second source/drain region may be a drain region, or vice versa. One of ordinary skill in the art would recognize many variations, modifications, and alternatives.

Some embodiments of the disclosure are described. Additional operations can be provided before, during, and/or after the stages described in these embodiments. Some of the stages that are described can be replaced or eliminated for different embodiments. Some of the features described below can be replaced or eliminated and additional features can be added for different embodiments. Although some embodiments are discussed with operations performed in a particular order, these operations may be performed in another logical order.

Overview

Packaging technologies were once considered just back-end processes, almost an inconvenience. Times have changed. Computing workloads have evolved more over the past decade than perhaps the previous four decades. Cloud computing, big data analytics, artificial intelligence (AI), neural network training, AI inferencing, mobile computing on advanced smartphones, and even self-driving cars are all pushing the computing envelope. Modern workloads have brought packaging technologies to the forefront of innovation, and they are critical to a product's performance, function, and cost. These modern workloads have pushed the product design to embrace a more holistic approach for optimization at the system level.

Integrated Fan-Out (InFO) package technology is becoming increasingly popular, particularly when combined with Wafer Level Packaging (WLP) technology in which integrated circuits are packaged in packages that typically include a redistribution layer (RDL) or post passivation interconnect that is used to fan-out wiring for contact pads of the package, so that electrical contacts can be made on a larger pitch than contact pads of the integrated circuit. Such resulting package structures provide for high functional density with relatively low cost. It is desirable for performance improvement on InFO package structures.

In some implementations, an InFO package has a multi-layered structure including a redistribution layer (RDL) structure electrically connected to a die and an enhancement layer disposed over the RDL structure. The RDL structure includes one or more RDLs that are conductive. The traditional enhancement layer includes multiple openings that allow exposure of a portion of the RDLs of the RDL structure, and further allow accommodation of external solder balls that are engaged with and electrically connected to the RDLs of the RDL structure.

There are, however, some challenges related to the traditional enhancement layer of InFO packages. One challenge is the strength and stability of the interconnection between the external solder balls and the RDL structure. The openings of the traditional enhancement layer are usually formed by laser drilling at relatively high laser energy, which may generate excessive local heat and internal stress. The excessive local heat and internal stress may damage the InFO package, cause the cracking and delamination of the enhancement layer, and cause the cracking of the solder balls placed in the openings. The local heat may further promote growth of unwanted copper dendrite at the interconnection, which in turn increases the failure rate during reliability tests.

Second, the traditional design of the openings leaves large voids due at least partially to the dimensional mismatch between the opening and solder balls. The voids, if not properly treated, may also cause mechanical damages to the internal components and interconnections of the package, induce warpage of the package, and undermine the coplanarity of the multiple components in the package.

Third, the traditional InFO package lacks an effective means to provide customers with identification information.

In accordance with some aspects of the disclosure, novel InFO package structures and semiconductor package structures are provided. In the novel InFO package structure, an improved enhancement layer is provided. The improved enhancement layer includes a plurality of cascaded openings. The cascaded openings have multiple openings in a cascaded manner in the vertical direction through the entire thickness of the enhancement layer. The cascaded openings provide at least the following advantages over the traditional openings without the cascaded design.

First, the cascaded openings are formed using a lower level of energy, thereby reducing the local heat generated in the process. The less local heat in turn mitigates the damages to the enhancement layer and the interconnections, reduces or prevents growth of copper dendrite, improves the coplanarity of the internal components or layers, and improves reliability yield and the overall process yield.

Second, the cascaded opening design allows to enlarge the effective space for filling, reduce the voids in the openings after the solder balls are disposed therein, facilitate the flow efficiency of underfill, and increase the amount of underfill during the subsequent package-on-package process.

Moreover, the improved enhancement layer of the present disclosure further includes a three-dimensional (3D) pattern on an outer surface thereof. The 3D pattern includes a plurality of recesses that also facilitate the flow of the underfill and further increase the amount of underfill injected into the voids of the package. In addition, the 3D pattern can provide a quick and effective means to carry identification information that is recognizable by the customers.

Example Semiconductor Package Structure

Figure 1B:
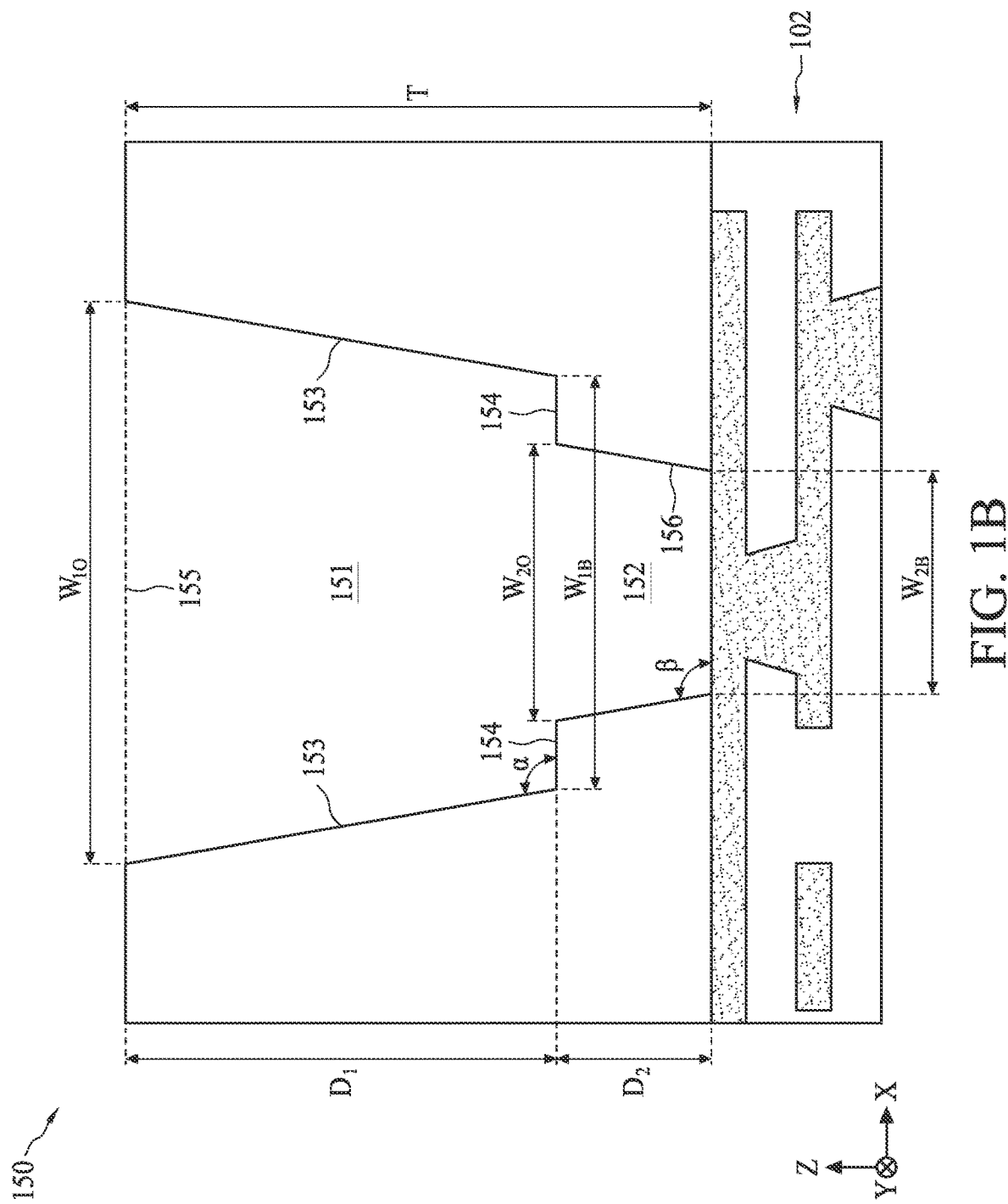
FIG. 1B is an enlarged cross-sectional view of an example cascaded opening of the semiconductor package shown in FIG. 1A in accordance with some embodiments.
Figure 1C:
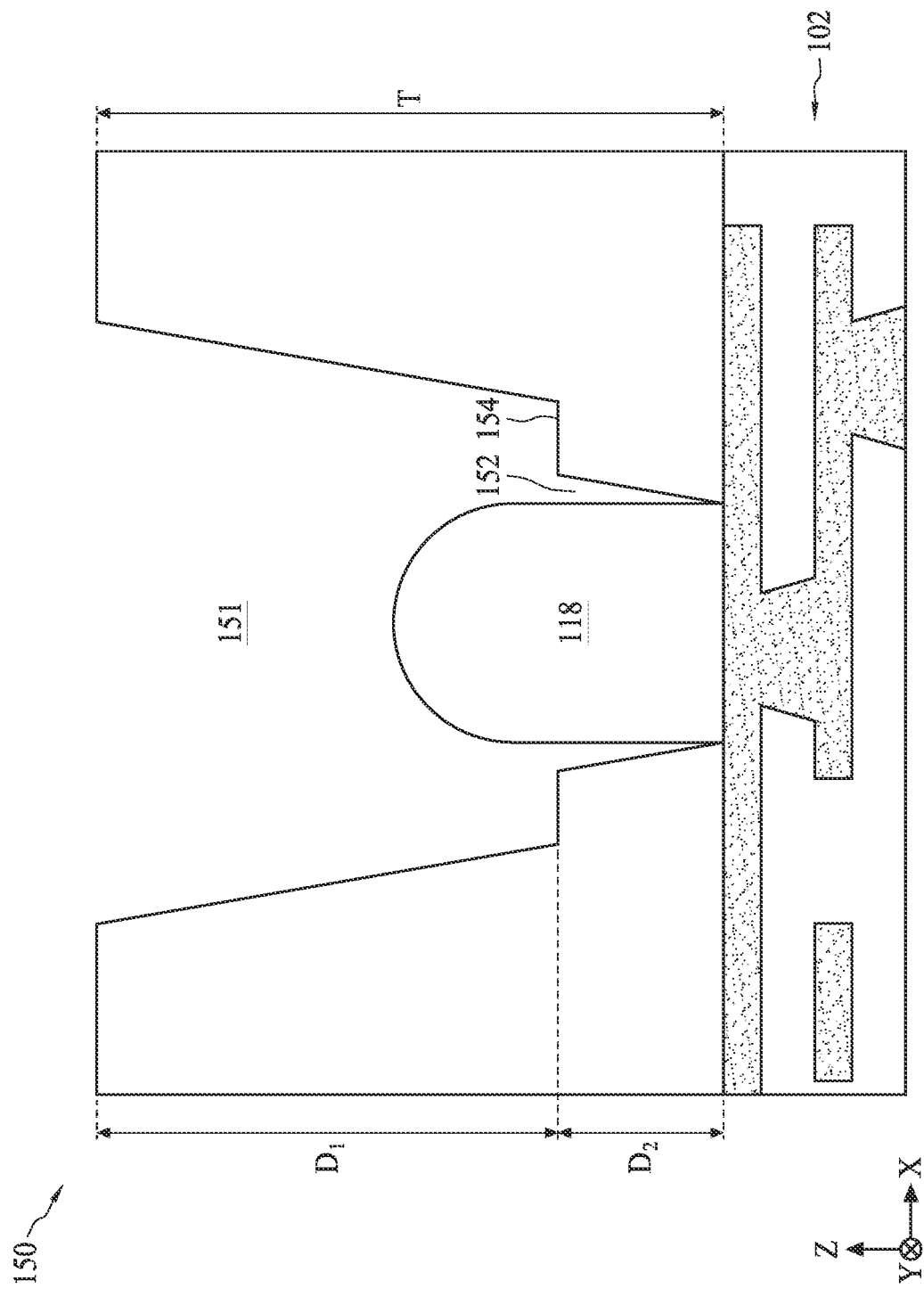
FIG. 1C is an enlarged cross-sectional view of another example cascaded opening of the semiconductor package shown in FIG. 1A in accordance with some embodiments.

Now referring to FIGS. 1A-1D, an example InFO package structure 100 and various components thereof are illustrated and described. FIG. 1A is a diagram illustrating an example InFO package structure 100 in accordance with some embodiments. FIG. 1B is an enlarged view of an example cascaded opening 150 of FIG. 1A. FIG. 1C is an enlarged view illustrating an example cascaded opening 150 and a pre-solder bump 118 disposed therein according to FIG. 1A. FIG. 1D is an enlarged view illustrating an example laser marking region 116 of FIG. 1A. It should be understood that the InFO package structure 100 and various components thereof are exemplary rather than limiting. One of ordinary skill in the art would recognize many variations, modifications, and alternatives within the contemplation of the present disclosure. It should also be understood that FIGS. 1A-1D are not drawn to scale.

In the illustrated example of FIG. 1A, the InFO package structure 100 is an InFO package including a first die 101, a first redistribution layer (RDL) structure 102, a second RDL structure 103, at least one through integrated fan-out via (TIV) 104, a molding compound 105, an enhancement layer 115, a pre-solder bump 118, a solder ball 122, and an integrated device 123.

In the illustrated example of FIG. 1A, the first die 101 has a frontside (denoted as "F" in FIG. 1A) and a backside (denoted as "B" in FIG. 1A). In some implementations, the first die 101 may be a compute die (sometimes also referred to as a "logic die") and include semiconductor devices. In some implementations, the semiconductor devices are designed for mobile applications, and may be central processing unit (CPU) dies, power management integrated circuit (PMIC) dies, transceiver (TRX) dies, or the like. While only the first die 101 is shown in FIG. 1, it should be understood that this is not intended to be limiting, and multiple dies can be included in the InFO package 100 in other embodiments. In another implementation, a die stack (i.e., multiple dies stacking together) can be included in the InFO package 100.

Figure 4A:
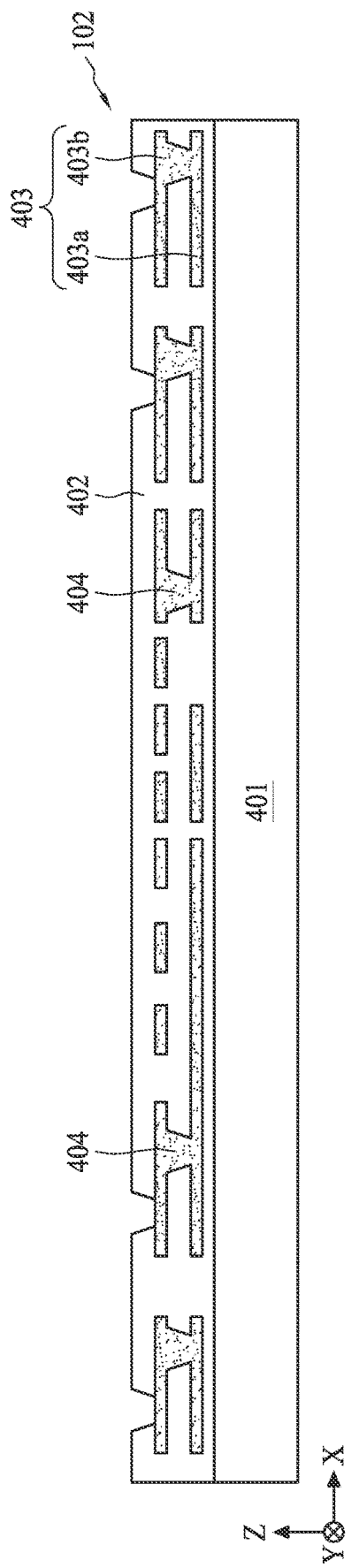
FIGS. 4A-4K are schematic cross-sectional views of a semiconductor package structure at various stages in accordance with some embodiments.
Figure 4B:
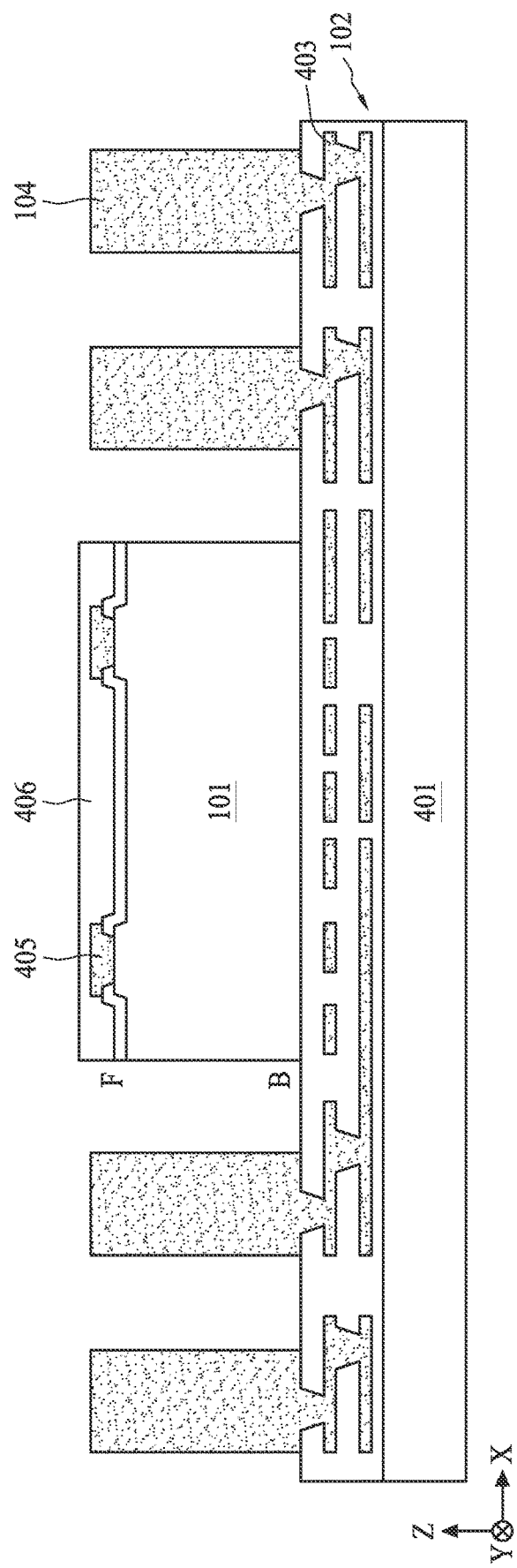
Figure 4C:
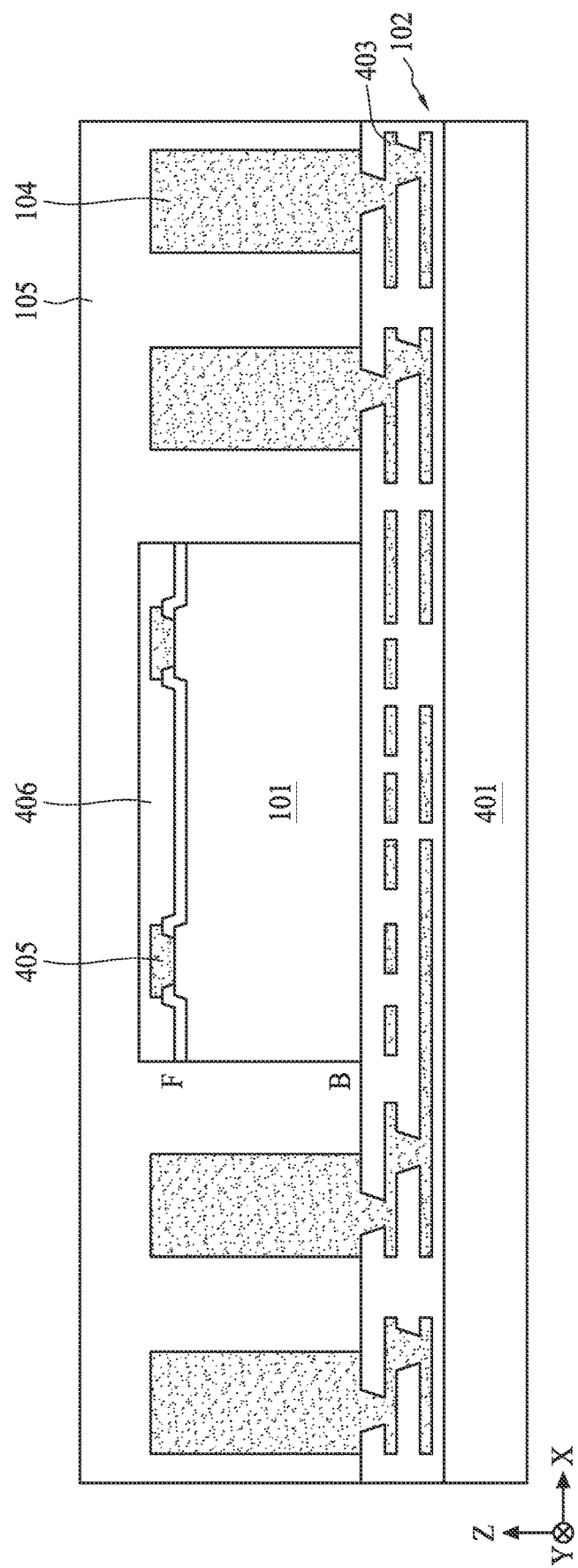

The first RDL structure 102 is disposed on the backside (B) of the first die 101 along the vertical direction (i.e., the Z-direction shown in FIG. 1A). The second RDL structure 103 is disposed on the frontside (F) of the first die 101 along the Z-direction opposing to the first RDL structure 102 along the Z-direction. The second RDL structure 103 is in direct electrical contact with the first die 101. Details of the RDL structures 102 and 103 and their interconnections with the first die 101 are illustrated in FIGS. 4A and 4E and will be discussed below.

In the illustrated example of FIG. 1A, a plurality of through integrated fan-out vias (TIVs) 104 are disposed lateral to the first die 101 and extending in the Z-direction to engage with both the first and the second RDL structures 102 and 103. The number of the TIVs 104 is not limited to that is shown in FIG. 1A, which may be adjusted according to the requirement. The TIVs 104 electrically connect the first and the second RDL structures 102 and 103, such that the first die 101 is also electrically connected to the first RDL structure 102 through the TIVs 104. A molding compound (or an encapsulant or the like) 105 is disposed between the first and the second RDL structures 102 and 103 and surrounds or encapsulates the first die 101 and the TIVs 104 in the horizontal plane (i.e., the X-Y plane shown in FIG. 1A). In some implementations, the molding compound 105 is a resin such as epoxy or the like.

In the illustrated example of FIG. 1A, an enhancement layer 115 is disposed on the first RDL structure 102 along the Z-direction. The enhancement layer 115 is made of a dielectric material that protects the first RDL structure 102 and is generally configured to enhance the bonding strength of the InFO package structure 100 to an external semiconductor device such as a second die 202 shown in FIG. 2A. In some implementations, the enhancement layer 115 includes a polymer material such as plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or combinations thereof. The enhancement layer 115 has a thickness (T, as shown in FIG. 1B) of about 10 µm to about 100 µm, or from about 25 µm to about 75 µm, or from about 40 µm to about 60 µm.

The enhancement layer 115 includes a laser marking region 116 and a bonding region 117. The laser marking region 116 is surrounded by the bonding region 117 on the X-Y plane as shown in FIG. 1A. The enhancement layer 115 has a plurality of cascaded openings 150 within the bonding region 117. The cascaded opening 150 may be in the form of recess, curve, groove, trench, and other shapes and configurations. The cascaded openings 150 are configured to accommodate and confine electrical connectors such as solder balls that engage with and are electrically bonded to the first RDL structure 102. The cascaded openings 150 are further configured to fan out the electrical connection of, for example, the first die 101 to another semiconductor device that is external to the InFO package structure 100.

Now referring to FIG. 1B, an enlarged cross-sectional view of the cascaded opening 150 according to FIG. 1A is illustrated. The cascaded opening 150 includes a primary opening 151 and a secondary opening 152 in a cascaded configuration along the Z-direction. The primary opening 151 is defined by a first side wall 153 and a bottom wall 154 and extends from a top surface 155, which is aligned with the outer surface of the enhancement layer 115, to the bottom wall 154. The primary opening 151 may have various shapes or configurations. For example, the primary opening 151 may be a prism, a pyramid, a cube, a cone, a cuboid, a quasi-sphere, a semi-sphere, and so on. Accordingly, the primary opening 151 may have a cross-sectional shape in the X-Y plane that is square, rectangle, circle, ellipse, and so on.

The primary opening 151 has a critical dimension of opening ($CD_{1O}$, whereas "O" stands for "opening") and a critical dimension of bottom ($CD_{1B}$, whereas "B" stands for "bottom"). The critical dimension of opening for the primary opening 151 may be the largest opening width in the X-Y plane. For example, if the primary opening 151 has a circular cross-sectional shape in the X-Y plane, the critical dimension of opening is the diameter of the circular cross-section. For the sole purpose of convenience, the $CD_{1O}$ of the primary opening 151 is herein represented by and used interchangeably with a first opening width ($W_{1O}$) along the X-direction, and the $CD_{1B}$ of the primary opening 151 is similarly represented by and used interchangeably with a first bottom width ($W_{1B}$) along the X-direction. One of ordinary skill in the art would appreciate the characterization or calculation of the critical dimensions of opening and bottom for other cross-sectional shapes of the primary opening 151. The primary opening 151 has a first depth ($D_1$) extended from the top surface 155 to the bottom wall 154 along the Z-direction.

The first side wall 153 of the primary opening 151 may be flat or curved in shape and may have a slope relative to the bottom wall 154. The first side wall 153 has a first angle ($\alpha$) relative to the first bottom wall 154. In other words, the first side wall 153 and the first bottom wall 154 define the first angle ($\alpha$). In some embodiments, $W_{1O}$ is greater than $W_{1B}$. Accordingly, the first angle ($\alpha$) is greater than 90°, for example, about 100° or more, or about 120° or more. The first depth ($D_1$) of the primary opening 151 is less than the thickness (T) of the enhancement layer 115, such that the bottom wall 154 is distanced from the first RDL structure 102. In some implementations, $D_1$ is about 90% or less, or about 80% or less, or about 70% or less, or about 60% or less, or about 50% or less, relative to T. In some embodiments, $D_1$ is about 80 µm or less, about 60 µm or less, about 40 µm or less, or about 20 µm or less.

In the illustrated example of FIG. 1B, the secondary opening 152 extends from the bottom wall 154 all the way to an outer surface of the first RDL structure 102 along the Z-direction such that a portion of the outer surface of the first RDL structure 102 is directly exposed by the secondary opening 152. The secondary opening 152 is further defined by a second side wall 156 and the outer surface of the first RDL structure 102. Similar to the primary opening 151, the secondary opening 152 has a critical dimension of opening ($CD_{2O}$) represented by the second opening width ($W_{2O}$) along the X-direction, a critical dimension of bottom ($CD_{2B}$) represented by a second bottom width ($W_{2B}$) along the X-direction, and a second depth ($D_2$) measured by the distance from the bottom wall 154 to the exposed surface of the first RDL structure 102 along the Z-direction. Similar to the primary opening 151, the second side wall 156 of the secondary opening 152 may be flat or curved in shape, and may have a slope relative to the first RDL structure 102. The second side wall 156 has a second angle ($\beta$) relative to the exposed surface of the first RDL structure 102. In other words, the second side wall 156 and the exposed surface of the first RDL structure 102 define the second angle ($\beta$). In some embodiments, $W_{2O}$ is greater than $W_{2B}$. Accordingly, the second side wall 156 may have a second angle ($\beta$) greater than 90°, e.g., of about 100° or more or of about 120° or more, relative to the first RDL structure 102.

It is noted that the cascaded opening 150 is through the entire enhancement layer 115 along the Z-direction, such that the total of $D_1$ and $D_2$ is equal or approximate to T of the enhancement layer. In some implementations, $D_2$ is about 50% or less, or about 40% or less, or about 30% or less, or about 20% or less, or about 10% or less, relative to T. The ratio of $D_1$ to $D_2$ is at least 1:1, or at least 2:1, or at least 3:1, or at least 4:1, or at least 5:1, or at least 10:1, or at least 20:1. In some implementations, the secondary opening 152 is at least 40%, at least 60%, or at least about 80% smaller than the primary opening 151 in total volume.

In some embodiments, $W_{1O}$, $W_{1B}$, $W_{2O}$, and $W_{2B}$ of the cascaded opening 150 is in accordance with the following relationship: $W_{1O} > W_{1B} > W_{2O} > W_{2B}$. That is, the primary opening 151 has a tapered profile in the X-Z plane, the secondary opening 152 has a tapered profile in the X-Z plane as well, and the opening (i.e., top) of the secondary opening 152 is smaller than the bottom of the primary opening 151. As such, the secondary opening 152 is more localized as compared to the primary opening 151; the location of the secondary opening 152 in the horizontal plane (i.e., the X-Y plane shown in FIG. 1B) is more fine-tuned as compared to the location of the primary opening 151.

In some implementations, the cascaded opening 150 is formed by sequential laser drilling processes. As one example, the primary opening 151 is first formed by laser drilling the enhancement layer 115 using a first laser energy. The secondary opening 152 is then formed by laser drilling through a portion of the bottom wall 154 using a second laser energy. The second laser energy may be smaller than the first laser energy to arrive at the secondary opening 152 with a smaller dimension. A person having ordinary skill in the art would appreciate the laser energy, drilling direction, and/or drilling time used to form the cascaded opening and control the relative shape and size of the primary opening 151 and the secondary opening 152.

Now referring to FIG. 1C, the InFO package structure 100 further includes a pre-solder bump 118 disposed in one cascaded opening 150. In some implementations, the pre-solder bumps 118 include lead-free solder, SnAg, or a solder material including alloys of tin, lead, silver, copper, nickel, bismuth, or combinations thereof. The pre-solder bumps 118 may be formed by placing solder balls or plating a solder layer or printing a pre-solder bump layer with a reflowing process. In some implementations, the pre-solder bumps 118 is a copper pillar bump, a metal bump including nickel or gold, or combinations thereof. In one implementation, each of the pre-solder bumps 118 has a diameter less than about 50 μm, or less than about 25 μm, or less than about 15 μm.

The pre-solder bump 118 is engaged with and electrically connected to the first RDL structure 102 and has a height (Hi) smaller than the thickness (T) of the enhancement layer 115. In some implementations, Hi is about 50% or less, or about 30% or less, or about 15% or less relative to T. The pre-solder bump 118 is vertically confined by the primary opening 151 along the Z-direction and horizontally confined by the secondary opening 152 in the X-Y plane. The pre-solder bump 118 is further aligned with the second opening width ($W_{2O}$) of secondary opening 152. In some implementations, a top portion of the pre-solder bumps 118 is exposed and extend above the bottom wall 154 of the primary opening 151.

The secondary opening 152 of the cascaded opening 150 provides additional space to increase the contact area between the pre-solder bump 118 and the first RDL structure 102 and reduce the void space therebetween, thereby improving the bonding strength and structural stability of the InFO package structure 100. As a note, the pre-solder bump 118 serves as a joint that can be used to connect the first RDL structure 102 and an external electrical connector such as a larger solder ball that is thereafter disposed in the primary opening 151. Thus, the cascaded opening 150 could advantageously improve the bonding strength between the larger solder balls and the first RDL structure 102.

Now referring to FIG. 1D, an enlarged view of the laser marking region 116 of FIG. 1A is illustrated. The laser marking region 116 includes a three-dimensional (3D) pattern 180 that has a textured outer surface as opposed to a flat outer surface. Similar to the cascaded opening 150, the 3D pattern 180 may be formed by an exposure and development process such as photolithography, laser drilling, or etching process. In some implementations, a laser drilling process is employed to form the 3D pattern using a relatively low laser energy and/or relatively short drilling time.

In some implementations, the 3D pattern 180 includes a plurality of recesses 181. The recess 181 has a relatively smaller dimension compared to the cascaded opening 150. The recess 181 may have various shapes and configurations, including but not limited to cube, cuboid, prism, pyramid, sphere, semi-sphere, at so on. The recess 181 has a depth ($D_3$) along the Z-direction. In some implementations, the average depth ($D_3$) of the recesses 181 is about 30% or less, or about 20% or less, or about 10% or less, relative to the thickness (T) of the enhancement layer 115. In some implementations, $D_3$ may be about 20 μm or less, or about 15 μm or less, or about 10 μm or less. The recesses 181 may have an average critical dimension (i.e., opening width in the X-Y plane) of about 1 μm to about 25 μm, or about 5 μm to about 20 μm, or about 10 μm to about 15 μm. In some implementations, the 3D pattern 180 includes an array of the recesses 181 aligned in the X-direction, or the Y-direction, or the X-Y plane. In some implementations, the outermost recesses 181 of the laser marking region 116 has a minimum distance from the innermost cascaded openings of the bonding region 117, as represented by $G_1$ shown in FIG. 1D. In some implementations, $G_1$ is at least about 100 μm, at least about 200 μm, or at least about 240 μm.

Now referring back to FIG. 1A, the InFO package structure 100 includes a plurality of solder balls 122 disposed on and engaged with the second RDL structure 103. It is noted that other suitable type of electrical connectors may also be used in lieu of the solder balls 122. Examples of the electrical connectors include metal pillars, controlled collapse chip connection (C4), electroless nickel-electroless palladium-immersion gold technique (ENEPIG), and so on. The electrical connectors may include a conductive material such as solder, copper, aluminum, gold, nickel, silver, palladium, tin, the like, or a combination thereof. The solder material of the solder balls 122 may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in semiconductor packaging applications.

Each solder ball 122 is electrically connected to the first die 101 through the second RDL structure 103. In some implementations, the InFO package structure 100 further includes an integrated device 123 engaged with and electrically connected to the second RDL structure 103. The integrated device 123 may be an integrated passive device (IPD), a multilayer ceramic capacitor (MLCC), a voltage regulator, a capacitor, or other type of device.

Figure 2A:
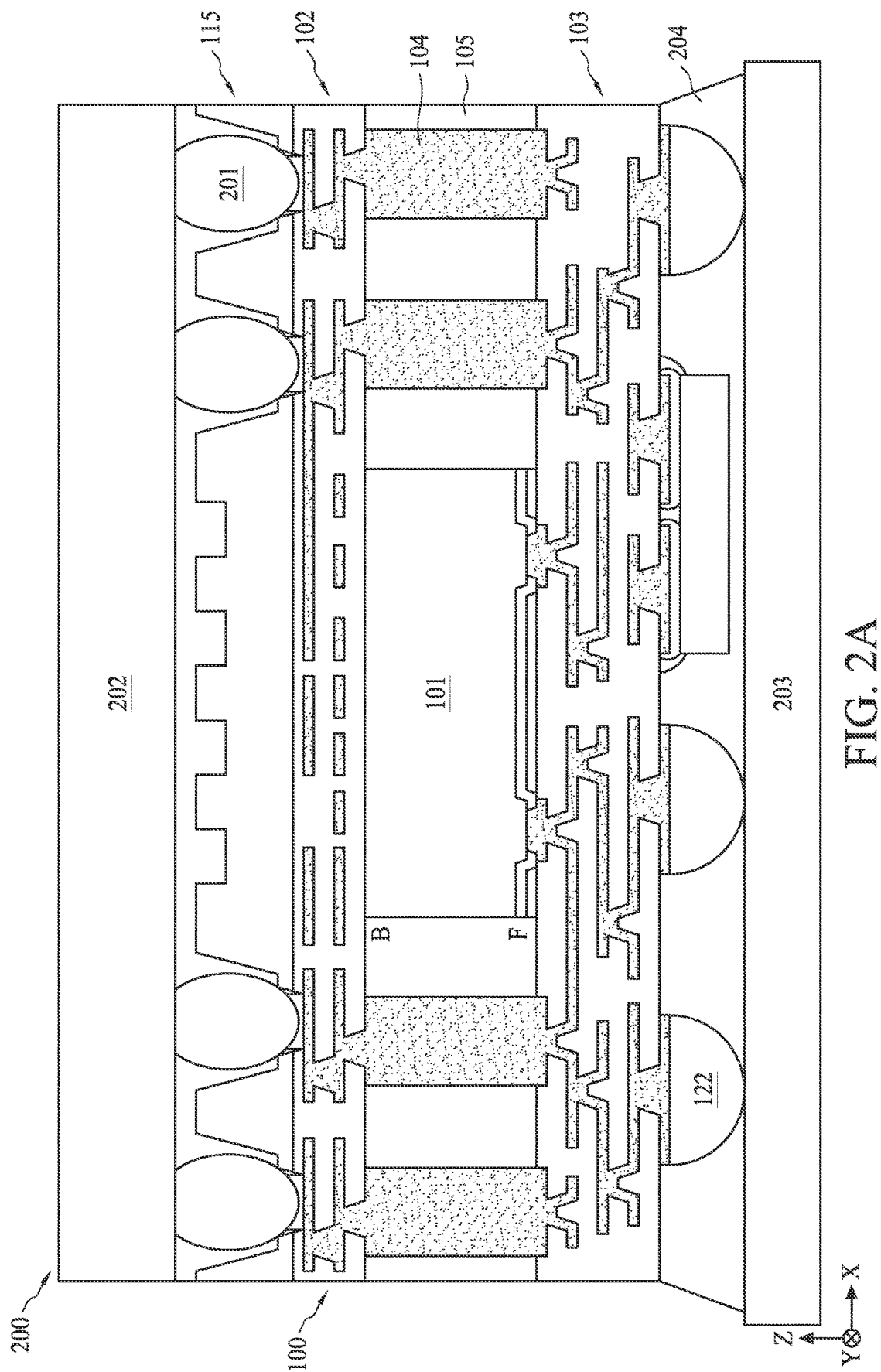
FIG. 2A is a schematic cross-sectional view of another example semiconductor package structure in accordance with some embodiments.
Figure 2B:
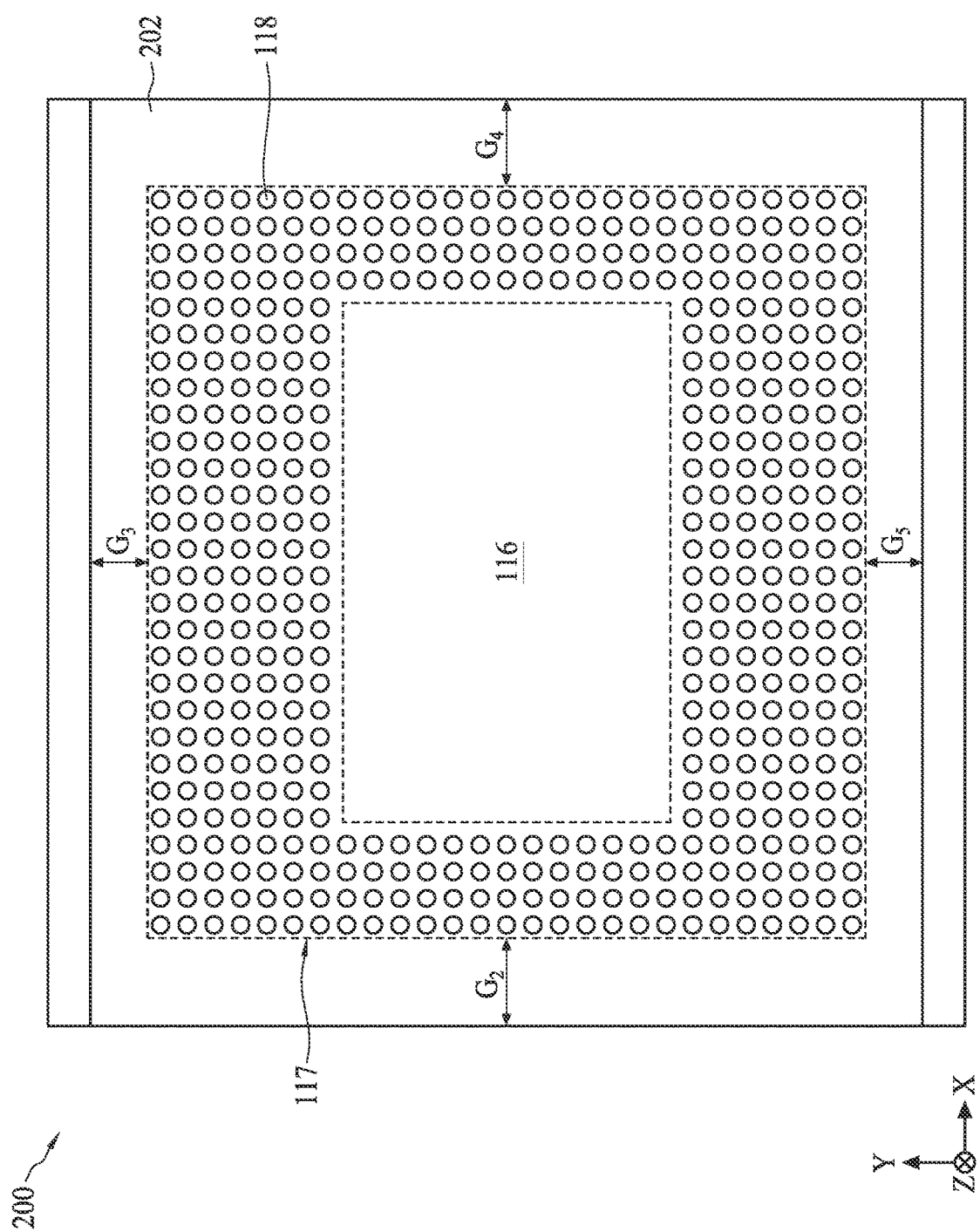
FIG. 2B is a schematic top view of the semiconductor package structure of FIG. 2A in accordance with some embodiments.

Now referring to FIGS. 2A-2B, an example semiconductor package structure 200 is illustrated and described. FIG. 2A is a cross-sectional view illustrating an example semiconductor package structure 200. FIG. 2B is a top view illustrating the semiconductor package structure 200 of FIG. 2A. In the illustrated example, the semiconductor package structure 200 includes an InFO package structure 100, a plurality of solder balls 201, a second die 202, a printed circuit board (PCB) 203, and an underfill 204. It should be understood that the semiconductor package structure 200 and various components thereof are exemplary rather than limiting. One of ordinary skill in the art would recognize many variations, modifications, and alternatives within the contemplation of the present disclosure. It should also be understood that FIGS. 2A-2B are not drawn to scale.

In the illustrated example of FIG. 2A, the second die 202 is overlayed with the first RDL structure 102 of the InFO package structure 100 along the Z-direction. The second die 202 may be a chip or a multi-chip die. In some embodiments, the second die 202 is a dynamic random access memory (DRAM). The second die 202 is electrically connected to the first RDL structure 102 through a plurality of solder balls 201 disposed therebetween. The solder balls 201 may be similar in size and composition to the solder balls 122 described above. Each solder ball 201 is disposed into one cascaded opening 150 and jointed with the corresponding pre-solder bump 118 therein. As shown in FIG. 2A, the pre-solder bump 118 fills substantially the secondary opening 152 and the solder ball 201 fills substantially the primary opening 151. Thus, the design of cascaded opening 150 allows for enlargement of the effective filling space and reduction of the voids between the second die 202 and the first RDL structure 102, which leads to improvement on bonding strength between the second die 202 and the first RDL structure 102, as compared with traditional openings without the cascaded opening design.

FIG. 2B shows the relative dimension of various components of the semiconductor package structure 200 in the X-Y plane. The laser marking region 116 (shown in dashed line in FIG. 2B) of the enhancement layer 115 is encompassed by the bonding region 117 in the X-Y plane and surrounded by the pre-solder bumps 118 in the X-Y plane. The bonding region 117 is further encompassed by the second die 202 in the X-Y plane. The outer edges of the bonding region 117 have a distance (i.e., $G_1$, $G_2$, $G_3$, or $G_4$ shown in FIG. 2B) to the corresponding edges of the second die 202. In some implementations, $G_1$, $G_2$, $G_3$, or $G_4$ are each at least about 50 µm, or at least about 75 µm, or at least about 100 µm.

The underfill 204 can be a material such as a molding compound, an epoxy, an underfill material, a molding compound underfill (MUF), a resin or the like. The underfill 204 filled in the voids of the semiconductor package structure 200 can protect the interconnections such as pre-solder bumps 118 and solder balls (122 and 201), improve the bonding strength between or among the various layers, improve integrity and provide structural support for the semiconductor package structure 200.

Example Methods for Fabricating the Semiconductor Package Structure

Figure 3A:
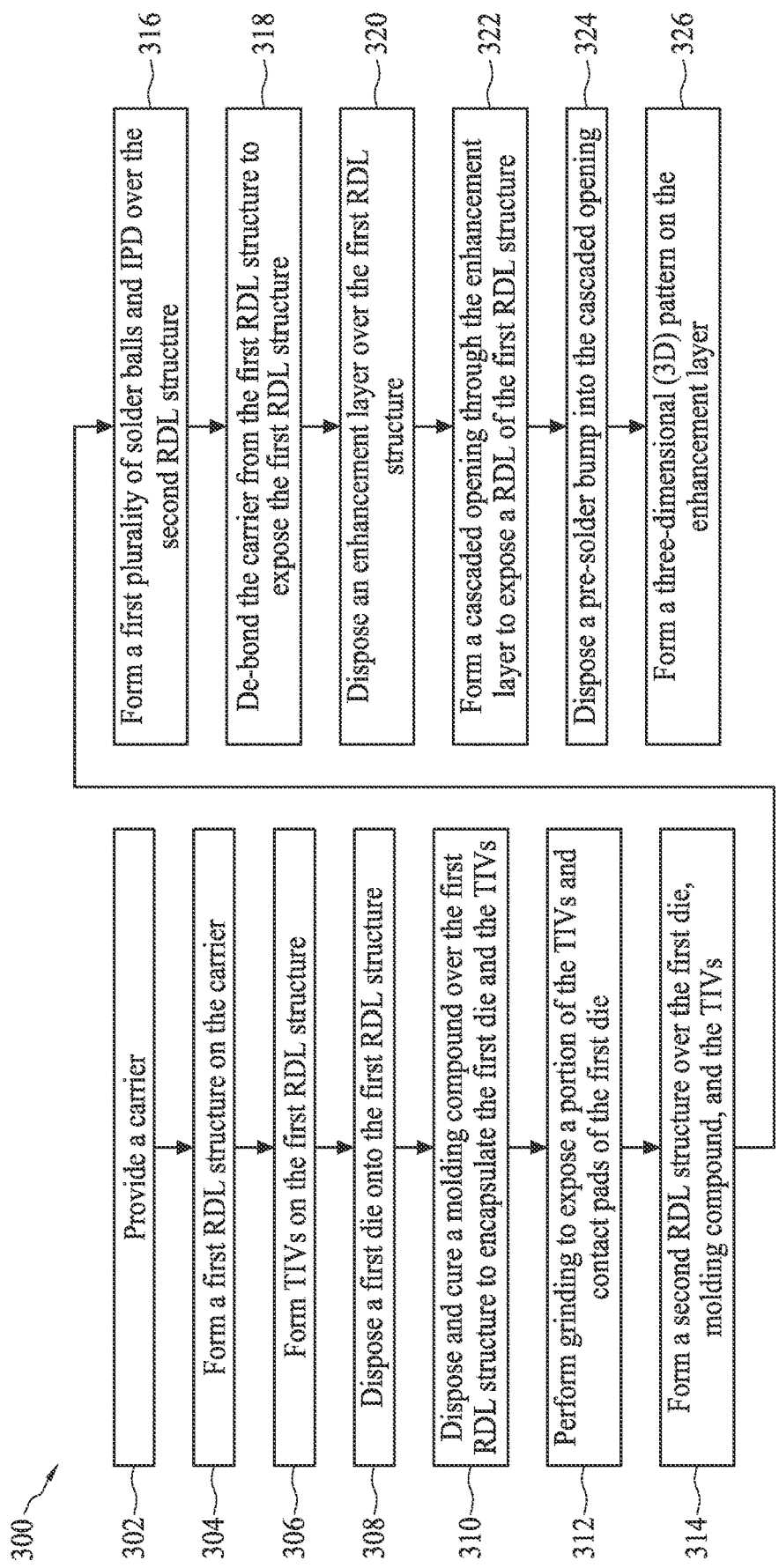
FIG. 3A is a flowchart illustrating an example method of forming an InFO package structure in accordance with some embodiments.
Figure 3B:
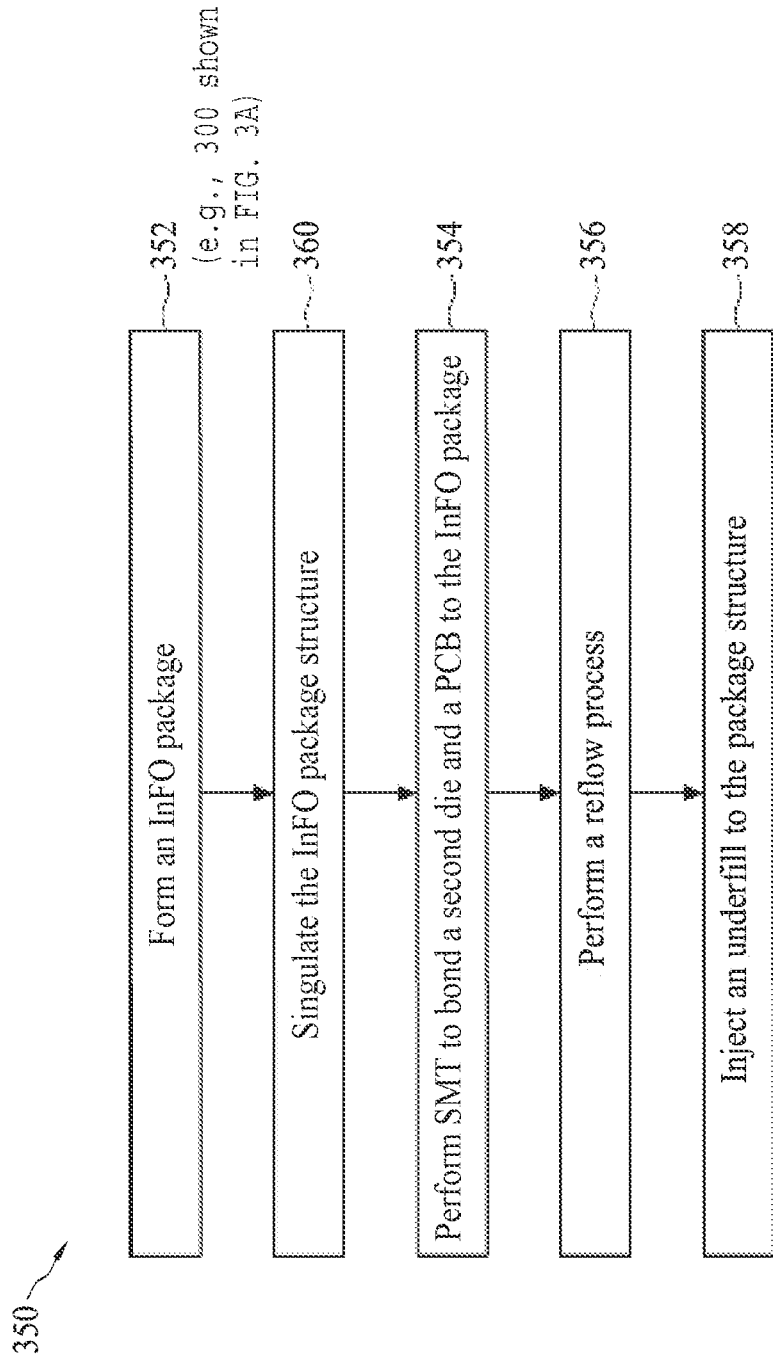
FIG. 3B is a flowchart illustrating an example method of forming a semiconductor package structure in accordance with some embodiments.

Now referring to FIGS. 3A-3B and 4A-4K, example methods for making the present semiconductor package structures and intermediate package structures at various stages thereof are illustrated and described. FIG. 3A is a flowchart illustrating an example method 300 for fabricating an InFO package structure in accordance with some embodiments. FIG. 3B is a flowchart illustrating an example method 350 for fabricating a semiconductor package structure that includes an InFO package structure in accordance with some embodiments. FIGS. 4A-4K are schematic cross-sectional views of a semiconductor package structure at various stages of the method 300 or 350.

In the illustrated example of FIG. 3A, a method for fabricating an InFO package structure includes operations 302, 304, 306, 308, 310, 312, 314, 316, 318, 320, 322, 324, and 326. Additional operations may be performed. Also, it should be understood that the sequence of the various operations discussed above with reference to FIG. 3A is provided for illustrative purposes, and as such, other embodiments may utilize different sequences. For example, operation 326 may be performed before operation 322 in other embodiments. These various sequences of operations are to be included within the scope of embodiments.

At operation 302, a carrier is provided. As shown in FIG. 4A, the carrier 401 includes, for example, silicon-based materials, such as glass or silicon oxide, or other materials, such as aluminum oxide, combinations of any of these materials, or the like. The carrier 401 is planar in order to accommodate an attachment of a RDL structure thereto. In some implementations, operation 302 further includes forming a release layer (not shown) on the carrier 401. At operation 304, the first RDL structure 102 is formed and disposed onto the carrier 401 or the release layer on the carrier 401. The release layer is generally configured to facilitate de-bonding and removal of the carrier from the first RDL structure 102 in subsequent operations.

In some implementations, forming the first RDL structure 102 further includes forming a dielectric layer 402 on the carrier 401. The dielectric layer 402 may be a polymer layer (PM). The polymer layer may include, for example, polyimide, polybenzoxazole (PBO), benzocyclobutene (BCB), an ajinomoto buildup film (ABF), a solder resist film (SR), or the like. Moreover, the first RDL structure 102 is formed in the dielectric layer 402, and portions of the first RDL structure 102 are exposed through the dielectric layer 402. In some implementations, the formation of one RDL 403 of the first RDL structure 102 includes forming a blanket copper seed layer, forming and patterning a mask layer over the blanket copper seed layer, performing a plating to form the RDL 403, removing the mask layer, and performing a flash etching to remove the portions of the blanket copper seed layer not covered by the RDL 403. In alternative implementations, the RDL 403 is formed by depositing metal layers, patterning the metal layers, and filling gaps between the RDL 403 with the dielectric layers 402. The RDL 403 may be continuous or alternatively segmented in various lengths in the X-Y plane. The various layers of the RDL 403 shown in FIG. 4A is for illustration, and various embodiments of the present disclosure are not limited in this regard. In some implementations, the dielectric layer 402 with plural layers of the RDLs 403 (e.g., 403a, 403b, etc) is formed on the carrier 401. In some implementations, one or more conductive vias (interconnection features or the like) 404 are formed to electrically connect the two adjacent RDLs 403 (e.g., 403a and 403b).

At operation 306, a plurality of TIVs 104 is formed. As shown in FIG. 4B, the TIVs are disposed on and electrically connected to the first RDL structure 102. In some implementations, an end of the TIV 104 has a stepped shape and is engaged with the first RDL structure 102, specifically, an outer RDL 403 thereof. At operation 308, the first die 101 is disposed on the first RDL structure 102. As discussed above, the first die 101 has a frontside (F) and a backside (B). The backside (B) is in contact with the first RDL structure 102. The first die 101 is laterally surrounded by the TIVs 104.

The first die 101 further includes one or more contact pads 405 disposed on the frontside (F) and a protective layer 406 that is disposed on and covers the contact pads 405. The contact pads 405 may be made with aluminum (Al), copper (Cu), tin (Sn), nickel (Ni), gold (Au), silver (Ag), or other electrically conductive material. The formation of contact pads 405 may use an electrolytic plating, sputtering, physical vapor deposition (PVD), or electroless plating process. The size, shape, and location of the contact pads 405 are only for illustration purposes and are not limiting. The contact pads 405 may be of the same size or of different sizes. The protective layer 406 may include a dielectric material.

At operation 310, a molding compound 105 is disposed on the first RDL structure 102 to cover the first die 101 and the TIVs 104. As shown in FIG. 4C, the molding compound 105 is filled in the gaps between the first die 101 and the TIVs 104 and the gaps between or among the TIVs 104. The molding compound 105 surrounds and encapsulates the first die 101 and the TIVs 104, covers the outer surface of the first RDL structure 102, the first die 101, and the TIVs 104 in the X-Y plane. The molding compound 105 may include a polymer-based material. The term "polymer" can represent thermosetting polymers, thermoplastic polymers, or combinations thereof. The polymer-based material can include, for example, plastic materials, epoxy resin, polyimide, polyethylene terephthalate (PET), polyvinyl chloride (PVC), polymethylmethacrylate (PMMA), polymer components doped with fillers including fiber, clay, ceramic, inorganic particles, or combinations thereof. In some other implementations, the molding compound 105 includes a photo-sensitive or curable material such as PBO, polyimide, BCB, a combination thereof, or the like, which may be easily patterned by exposure and development processes. In alternative implementations, the molding compound 105 includes nitride such as silicon nitride, oxide such as silicon oxide, PSG, BSG, BPSG, a combination thereof, or the like. In some implementations, the molding compound 105 is further cured after being disposed on the first RDL structure 102.

Figure 4D:
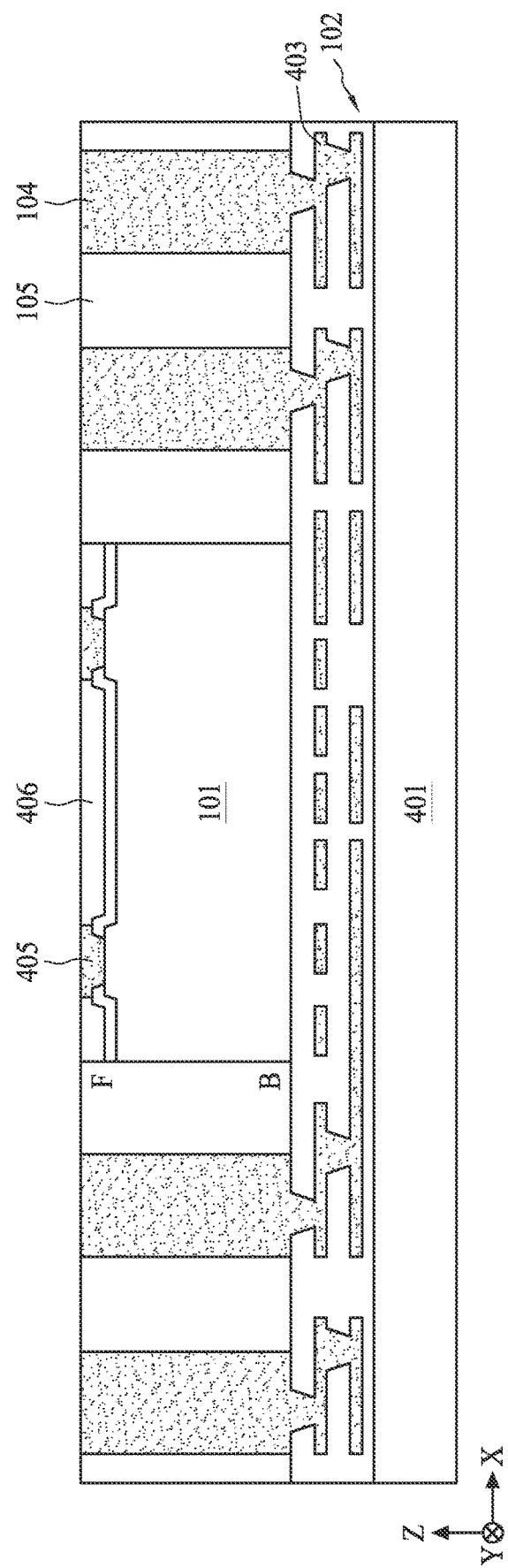
Figure 4E:
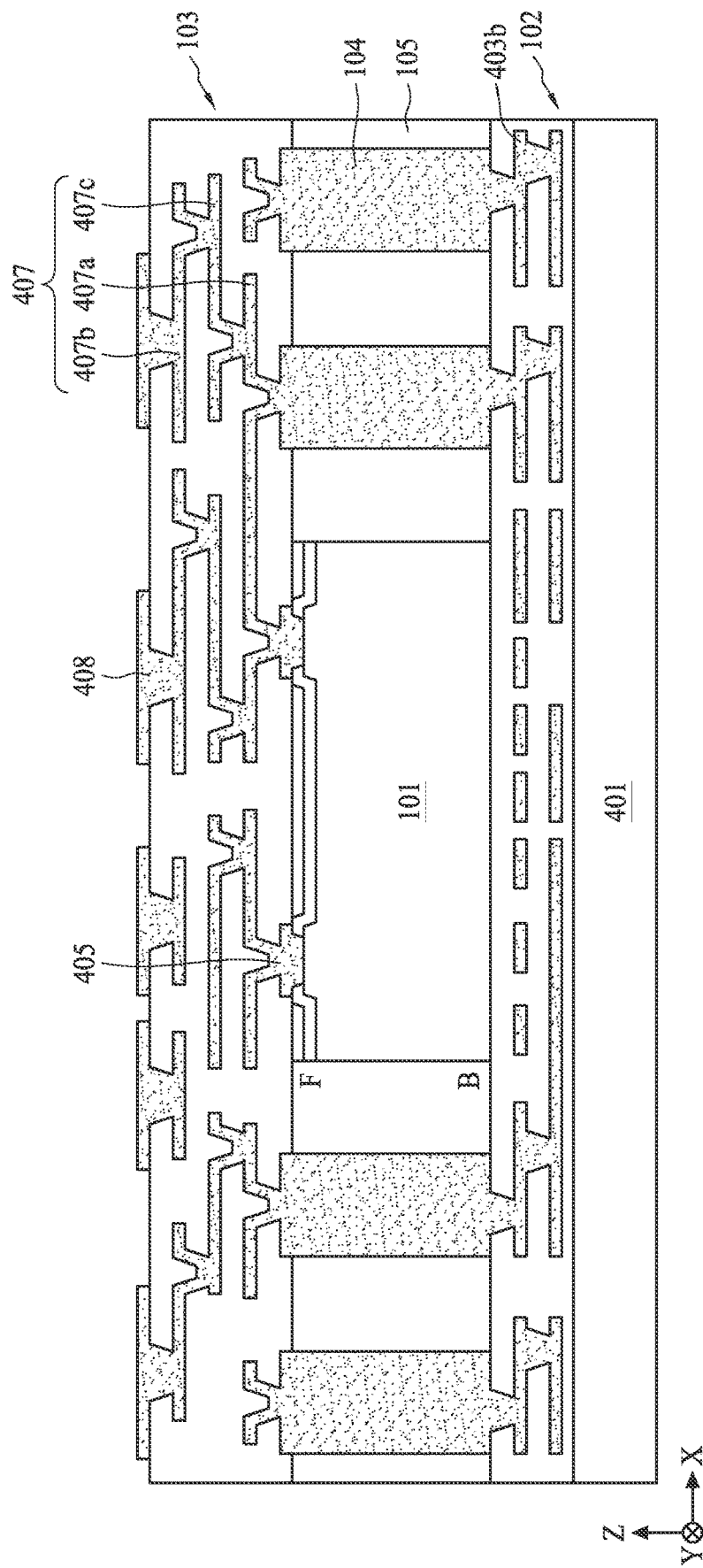

At operation 312, a grinding or polishing process is performed to remove a top portion of the molding compound 105 and a top portion of the protective layer 406, such that the top surfaces of the contact pads 405 and the TIVs 104 are exposed, as shown in FIG. 4D. In some implementations, the exposed top surfaces of the contact pads 405, the TIVs 104, and the molding compound 105 are coplanar or substantially coplanar in the X-Y plane. In some implementations, the grinding process is performed using chemical mechanical polishing (CMP). Afterwards, an additional thinning step may be performed by a planarization process such as CMP or etching to improve the coplanarity of the top surfaces of the contact pads 405, the TIVs 104, and the molding compound 105.

At operation 314, the second RDL structure 103 is formed and disposed over the exposed top surfaces of the first die 101, the TIVs 104, and the molding compound 105. The second RDL structure 103 may be formed in a similar manner as the first RDL structure, and details of forming the second RDL structure 103 will not be repeated. As shown in FIG. 4E, the second RDL structure may have multiple RDLs (e.g., 407a, 407b, 407c, etc.) similar to the RDLs 403 of the first RDL structure 102. The RDL 407a proximate the frontside (F) of the first die 101 is engaged with and electrically connected to the TIVs 104 and the contact pads 405 of the first die 101. In some implementations, operation 314 further includes forming an under-bump metallurgy (UBM) layer (not shown) on the outer surface of the second RDL structure 103. In some implementations, the UBM layer may include a plurality of exposed connectors 408. The connectors 408 are each electrically connected to one or more RDLs 407 of the second RDL structure 103. In alternative implementations, the UBM layer is formed before the connectors 408 are formed. The material of the UBM layer may include a metal or a metal alloy. The UBM layer is, for example, copper, tin, an alloy thereof, or a combination thereof. The UBM layer is formed by, for instance, physical vapor deposition or electroplating.

Figure 4F:
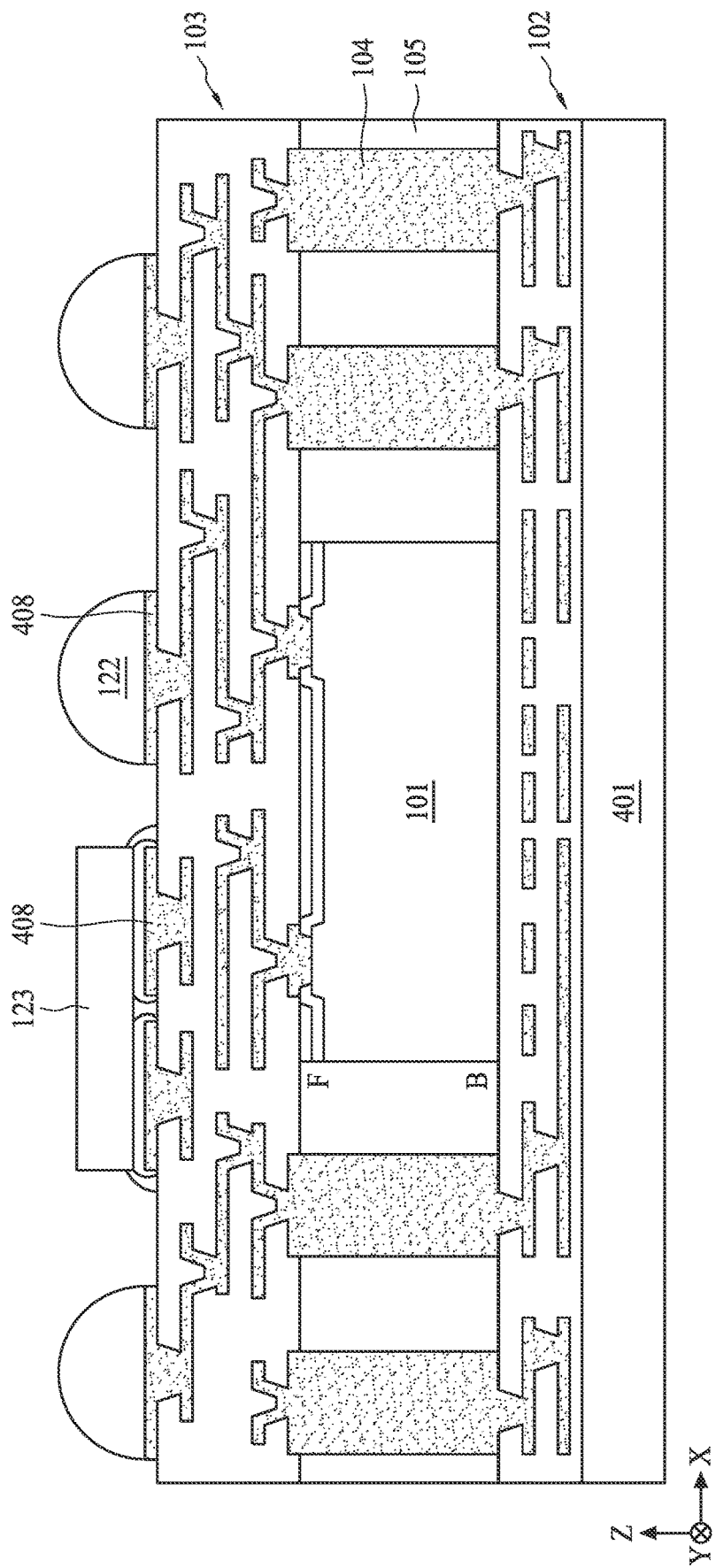

At operation 316, a plurality of solder balls 122 and an integrated device 123 are formed and disposed on an outer surface of the second RDL structure 103 in the Z-direction. As shown in FIG. 4F, the solder balls 122 and the integrated device 123 are each engaged with and electrically connected to the connectors 408 of the second RDL structure 103. In some implementations, the integrated device 123 is surrounded by the solder balls 122 in the X-Y plane.

Figure 4G:
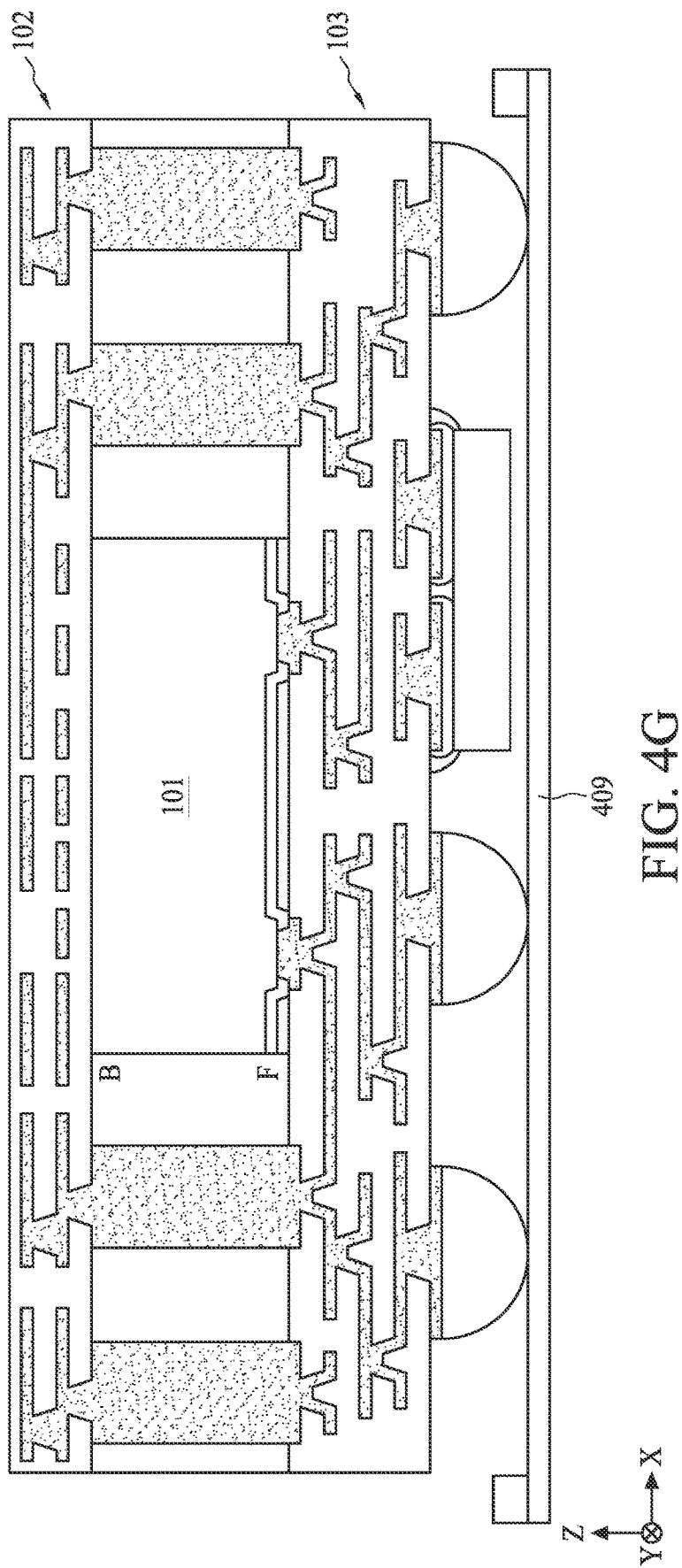

At operation 318, the carrier 401 is de-bonded from the first RDL structure 102. As discussed above, the release layer (not shown) between the carrier and the first RDL structure 102 may facilitate the de-bonding process. As shown in FIG. 4G, a dicing tape 409 is adhered to the solder balls 122, and the package structure of FIG. 4G is flipped over. Next, the carrier 401 is de-bonded from the structure to expose a surface of the first RDL structure 102.

Figure 4H:
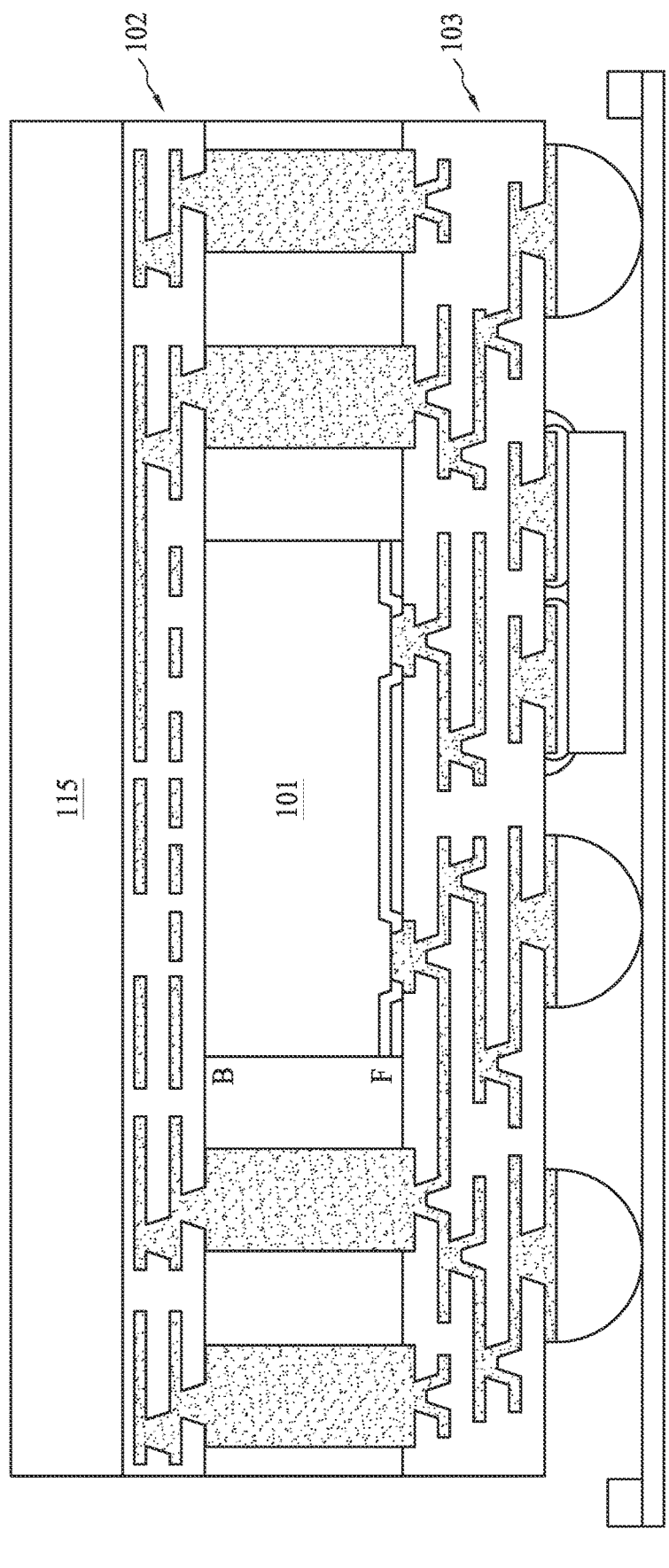

At operation 320, an enhancement layer 115 is formed. The enhancement layer 115 may be disposed onto the exposed surface of the first RDL structure 102 through a process such as lamination, coating, deposition, or similar processes. As discussed above, the enhancement layer 115 may include a dielectric material, a polymer material, a composite, or combinations thereof. The resulted structure is shown in FIG. 4H. A person having ordinary skill in the art will appreciate the operation parameters used to control the thickness of the enhancement layer 115 during the formation process.

Figure 4I:
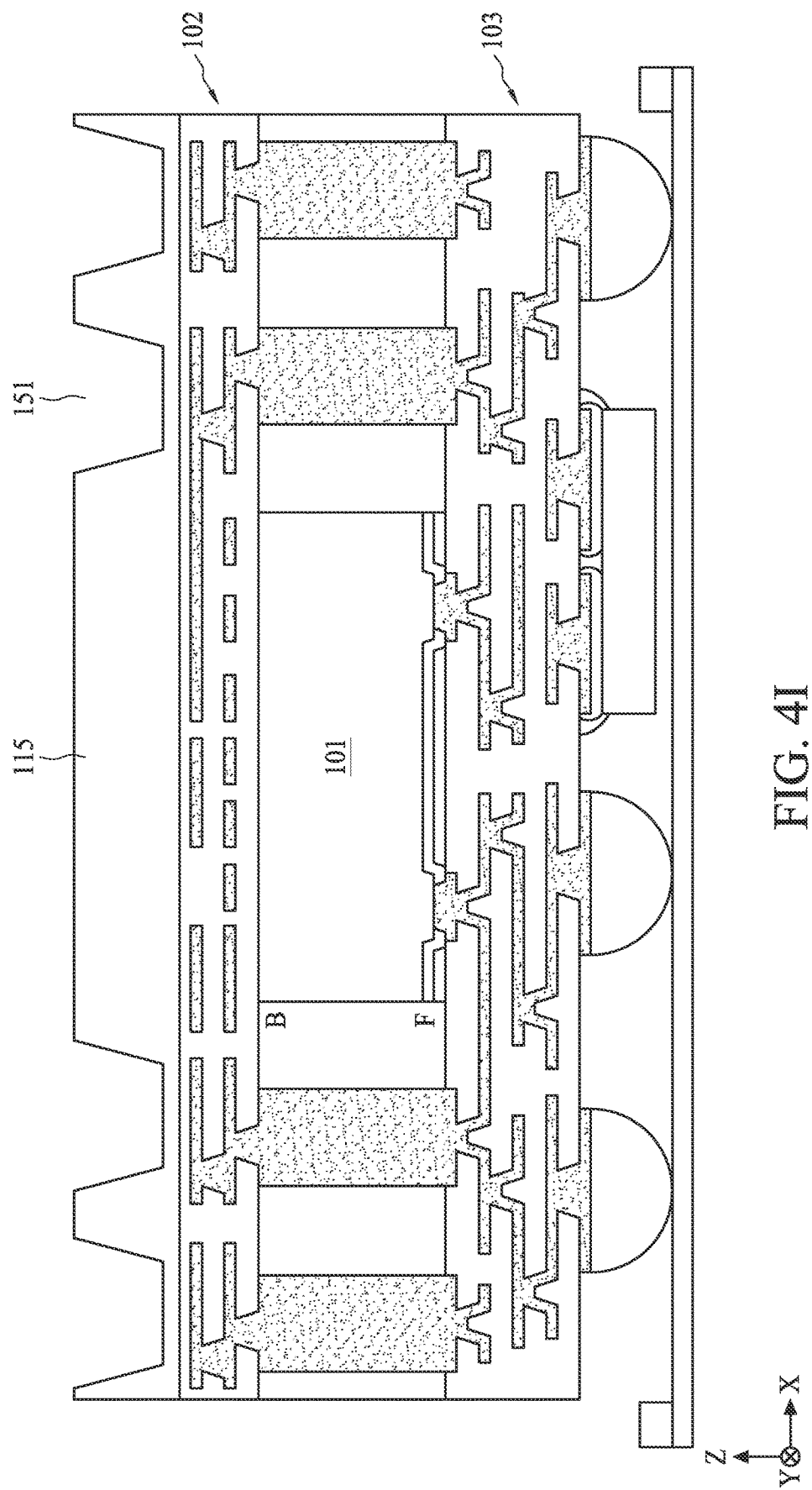

At operation 322, the enhancement layer 115 is further processed to form cascaded openings. As shown in FIG. 4I, a plurality of primary openings 151 is first formed by exposure and development processes, laser drilling process, photolithography and etching processes, or combinations thereof. In some implementations, the primary openings 151 are formed by a laser drilling process. As discussed above, the laser drilling parameters such as laser energy, drilling direction, and drilling time may be adjusted to control the shape, dimension, and depth of the resulting primary opening 151.

Figure 4J:
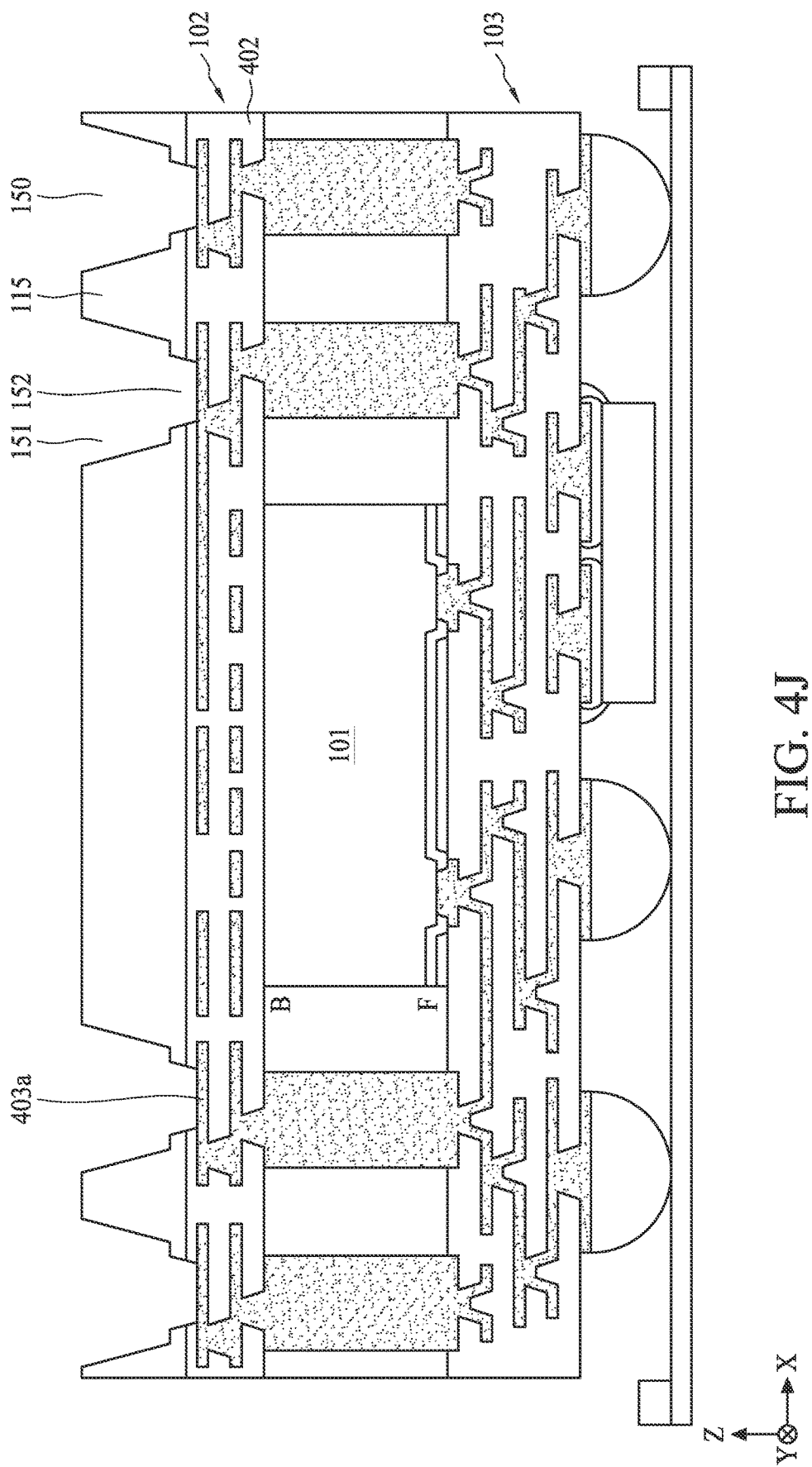

As shown in FIG. 4J, a plurality of secondary openings 152 is subsequently formed by the similar process such as laser drilling or photolithography to form the cascaded opening 150. It is noted that the laser drilling is performed to drill through the entire thickness of the enhancement layer 115 and an outer portion of the dielectric layer 402, such that at least a portion of the RDL 403a of the first RDL structure 102 is exposed to the secondary opening 152 in the Z-direction.

It should be noted that the secondary openings 152 due to the relatively smaller size may only require relatively low laser energy in the laser drilling process. The low laser energy may in turn reduce the amount of local heat generated during laser drilling and thus mitigate the damage caused by the local heat. For example, unfavorable copper dendrites are usually formed in interconnections due to the local heat of the laser drilling process. The cascaded openings 150 of the present disclosure may advantageously reduce the growth of copper dendrite due to the less local heat generated in the laser drilling process.

In some implementations, the cascaded openings 150 are formed by a photolithography process. For example, a photoresist is formed over the enhancement layer 115 and is then patterned by a patterned mask to expose some portions of the enhancement layer 115. The exposed portions of the enhancement layer 115 are removed by an etching process to form the primary openings 151. Then the patterned photoresist is removed by development. The secondary openings 152 are formed by the similar photolithography process to form the cascaded openings 150. In some implementations, the cascaded openings 150 are formed by a combination of photolithography and laser drilling in a sequential manner.

In some implementations, only a portion of the primary openings 151 is further processed to form the corresponding cascaded openings 150. In other words, the number of the secondary openings 152 is smaller than the total number of the primary openings 151. In alternative implementations, every primary opening is further processed to form the corresponding cascaded opening 150 such that the total number of the secondary openings 152 is about equal to the total number of the primary openings 151.

Figure 4K:
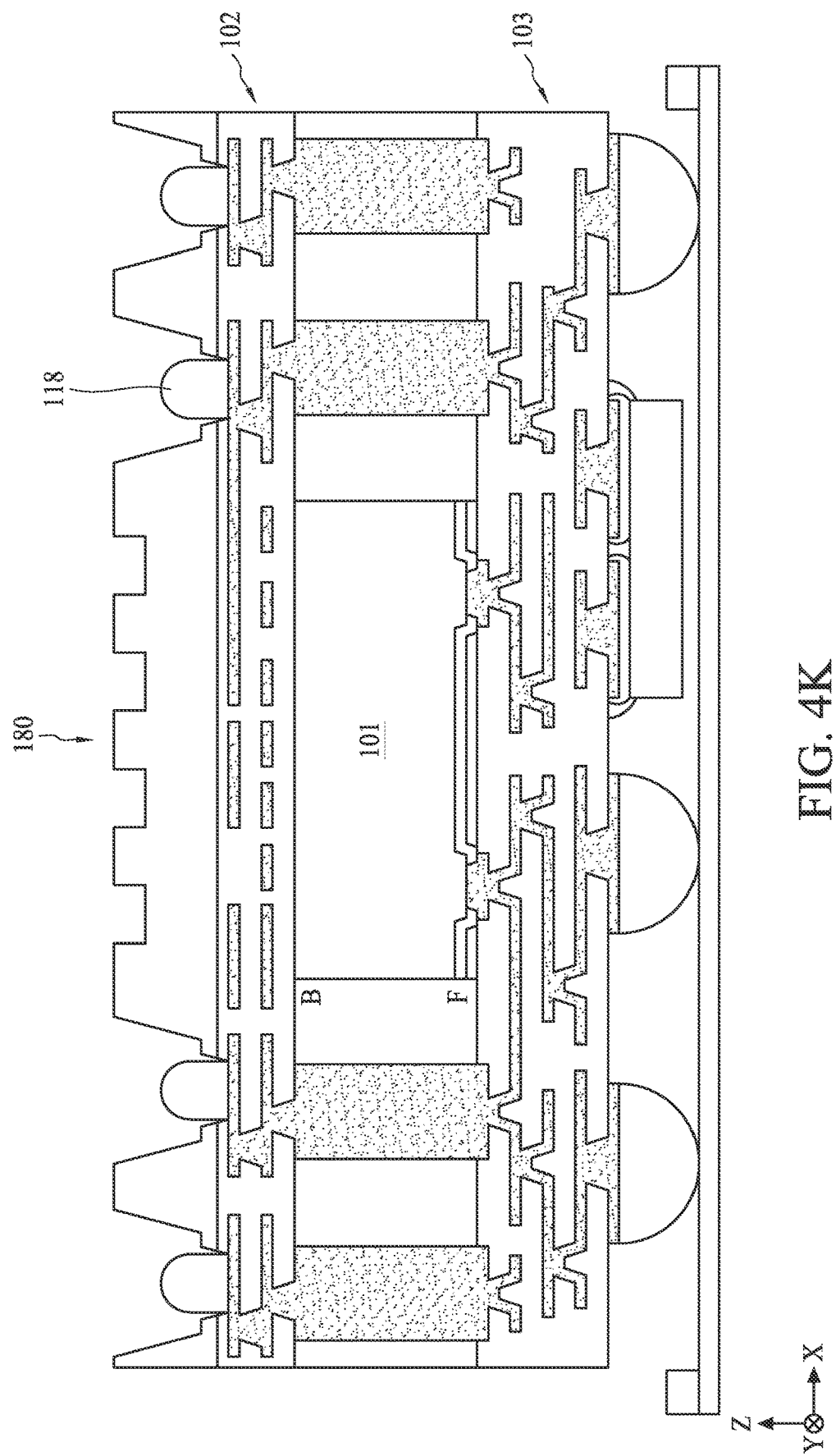

At operation 324, a plurality of pre-solder bumps is formed and disposed respectively into the cascaded openings. As shown in FIG. 4K, each pre-solder bump 118 is within the cascaded opening 150 and is engaged with and electrically connected to the exposed RDL 403a of the first RDL structure 102. In some implementations, the size and dimension of the pre-solder bumps 118 are controlled such that each pre-solder bump 118 is horizontally confined by the corresponding secondary opening 152 and aligned with the critical dimension of opening ($CD_{2O}$) thereof.

In some implementations, operation 324 further includes cleaning the package components. The cleaning process may be, e.g., a flux clean, which helps remove any residual material. The flux clean may be performed by flushing, rinsing, or soaking using hot water or a cleaning solvent. It is noted that the cascaded openings 150 of the present disclosure may improve the efficiency of the cleaning process due to the smaller size and less aspect ratio of depth (Z-direction) to width (X-Y plane), as compared to the traditional openings without the cascaded design.

At operation 326, a 3D pattern of the enhancement layer 115 is formed. As shown in FIG. 4K, the 3D pattern 180 is formed in the laser marking region 116 on the outer surface of the enhancement layer 115. The 3D pattern may be formed by a laser drilling process at relatively low laser energy. The 3D pattern may serve as an identification mark that carries the identification information of the respective package. The identification mark may include letters, number, or other identifiable patterns. In some implementations, the identification mark may contain information that is sensitive, confidential, unique, or otherwise recognizable only by the customer. In some implementations, the 3D pattern is formed by other suitable exposure and development processes such as photolithography or etching.

It should be understood that, in another embodiment, operation 326 is not performed. In other words, the InFO package structure fabricated may not include the 3D pattern in some embodiments.

Now referring to FIG. 3B, an example method 350 of fabricating a semiconductor package structure 200 is illustrated and described. In the illustrated example, the method 350 includes operations 352, 360, 354, 356, and 358. At operation 352, an InFO package structure 100 is formed by the implementation of, for example, method 300 shown in FIG. 3A.

At operation 360, the InFO package structure is dispensed through a singulation process such as sawing. In the example shown in FIGS. 3A-3B, operation 360 may be performed after operation 352 (and, therefore, after operation 326 shown in FIG. 3A). In one implementation, the singulation may be performed by using a saw blade (not shown) to slice through the entire structure along the Z-direction thereby separating one section from another. However, as one of ordinary skill in the art will recognize, utilizing a saw blade to singulate the InFO package structure 100 is merely one illustrative embodiment and is not intended to be limiting. Alternative methods for singulating the InFO package structure 100, such as utilizing one or more etches to separate the InFO package structure 100, may be utilized. These methods and any other suitable methods may be utilized to singulate the InFO package structure 100.

At operation 354, a PCB (e.g., the PCB 203 shown in FIG. 2A) and a second die (e.g., the second die 202 shown in FIG. 2A) are bonded to two sides of the InFO package structure (e.g., the InFO package structure 100 shown in FIG. 2A) to form the semiconductor package structure 200. In one implementation, a surface mount technology (SMT) is implemented to bond the second die and the PCB to the InFO package structure 100. In some implementations, the operation 354 further includes forming and disposing a plurality of solder balls 122 onto the second RDL structure 103 and attaching a PCB to the solder balls 122 such that the PCB and the second RDL structure 103 are electrically connected through the solder balls 122. The operation 354 may further include forming and disposing a plurality of solder balls 201 respectively into the cascaded openings 150 to electrically connect to the corresponding pre-solder bumps 118 therein and attaching the second die 202 to the solder balls 201 such that the second die 202 and the first RDL structure 102 are electrically connected through the solder balls 201, as shown in FIG. 2A.

At operation 356, a reflow process is performed on the solder balls of the semiconductor package structure 200. In some implementations, the reflow process includes heating the pre-solder bumps 118 and the solder balls 122 and 201 to a predetermined temperature, e.g., to a melting point of the material of the pre-solder bumps 118 and the solder balls 122 and 201. During the reflow process, the pre-solder bumps 118 and the solder balls 122 and 201 undergo a wetting process that causes adhesion of the solder balls 201 to the pre-solder bumps 118 and causes adhesion of the solder balls 122 to the second RDL structure 103. In some cases, the reflow process may cause the pre-solder bumps 118 and solder balls 201 to spread on the first RDL structure 102 and cause the solder balls 122 to spread on the second RDL structure 103.

At operation 358, an underfill is injected into the semiconductor package structure 200 to fill voids generated therein. As shown in FIG. 2A, the underfill 204 is injected into the voids of the semiconductor package structure 200. The voids include but are not limited to the space between the second die 202 and the first RDL structure 102, the space in the cascaded openings 150, the space of the recesses 181, and the space between the PCB 203 and the second RDL structure 103. As discussed above, the underfill 204 is important to protect the pre-solder bumps 118 and the solder balls 122 and 201. In addition, the underfill 204 may absorb some of the residual stresses, to reduce the stress within the solder balls 122 and 201, in the interfaces between the solder balls 201 and the first RDL structure 102, in the interfaces between the solder balls 122 and the second RDL structure 103, in the interfaces between the integrated device 123 and the second RDL structure 103, and within the cascaded openings 150.

It is noted that both the cascaded opening 150 and the 3D pattern 180 can facilitate the flow of underfill 204, increase the amount of underfill 204, and reduce the total volume of voids in the semiconductor package structure 200 after injection of the underfill 204. Specifically, the cascaded opening 150 may reduce the voids of the underfill due to the enlarged filling space of multiple openings (e.g., the primary opening 151 and the secondary opening 152). In addition, more underfill 204 and fewer voids in the semiconductor package structure 200 may release stress during reliability tests, prevent crack of the enhancement layer 115, prevent crack of pre-solder bumps 118 and solder balls 122 and 201, prevent growth of unfavorable copper dendrites, reduce warpage of the semiconductor package structure 200, and improve coplanarity of the internal components of the semiconductor package structure 200. Similarly, the 3D pattern 180 having a plurality of recesses 181 may also facilitate the flow of the underfill 204 into the recesses 181 due at least partially to the capillary effect, thereby increasing the amount of underfill 204 and reducing the total volume of voids of the semiconductor package structure 200, particularly when the space between the enhancement layer 115 and the second die 202 is narrow. In addition, the increased underfill injected into the recesses 181 may similarly release stress during reliability tests, thereby improving the process yield and reliability yield of the semiconductor package structure 200.

As a note, typical reliability tests include but are not limited to drop test, Unbiased Highly Accelerated Stress Test (UHAST), Biased Highly Accelerated Stress Tests (BHAST), and so on. The reliability tests are usually performed as in-line quality control to confirm the quality of the package structure, and in particular the quality of interconnections (such as solder bumps, solder balls, contact pads, or other types of connectors) within the package structure during the manufacturing process. Thus, improvement on the reliability test will reduce the failure rate and increase the overall process yield of the semiconductor package structures.

Summary

In accordance with some aspects of the disclosure, a semiconductor package structure is provided. The semiconductor package structure includes: a die having a frontside and a backside; a first redistribution layer (RDL) structure disposed on the backside of the die; a second RDL structure disposed on and electrically connected to the frontside of the die; a through integrated fan-out via (TIV) disposed lateral to the die and extending to electrically connect the first and the second RDL structures; a molding compound disposed between the first and second RDL structures; an enhancement layer disposed on the second RDL structure; a plurality of pre-solder bumps electrically connected to the first RDL structure; and a plurality of solder balls disposed on and electrically connected to the second RDL structure. The enhancement layer includes a plurality of cascaded openings. Each one of the cascaded openings includes: a primary opening defined by a first side wall and a bottom wall; and a secondary opening extended from the bottom wall of the primary opening to the first RDL structure. The secondary opening is smaller in critical dimension than the corresponding primary opening. Each of the pre-solder bumps is disposed in one of the cascaded openings and horizontally aligned with the secondary opening thereof.

In accordance with some aspects of the disclosure, a semiconductor package structure is provided. The semiconductor package structure includes: a first die having a frontside and a backside; a first redistribution layer (RDL) structure disposed on the backside of the first die; a second RDL structure disposed on and electrically connected to the frontside of the first die; a through integrated fan-out via (TIV) disposed lateral to the first die and extending to electrically connect the first and the second RDL structures; a molding compound disposed between the first and second RDL structures; an enhancement layer disposed on the second RDL structure; a plurality of pre-solder bumps electrically connected to the first RDL structure; a plurality of solder balls disposed on and electrically connected to the second RDL structure; a printed circuit board (PCB) electrically connected to the first die through a first plurality of solder balls disposed between the second RDL structure and the PCB; and a second die electrically connected to the first RDL structure through a second plurality of solder balls. The enhancement layer includes a plurality of cascaded openings. Each one of the cascaded openings includes: a primary opening defined by a first side wall and a bottom wall; and a secondary opening extended from the bottom wall of the primary opening to the first RDL structure. The secondary opening is smaller in critical dimension than the corresponding primary opening. Each of the pre-solder bumps is disposed in one of the cascaded openings and horizontally aligned with the secondary opening thereof. Each of the second plurality of solder balls is disposed in one of the cascaded openings and electrically connected to the corresponding pre-solder bump therein.

In accordance with some aspects of the disclosure, a method of fabricating a semiconductor package structure is provided. The method includes: providing a carrier; forming a first redistribution layer (RDL) structure on the carrier; forming a through integrated fan-out via (TIV), the TIV disposed on and electrically connected to the first RDL structure; disposing a first die onto the first RDL structure, the first die having a frontside and a backside, wherein the backside is in contact with the first RDL structure; disposing a molding compound over the first RDL structure to encapsulate the first die and the TIV; performing grinding to expose a portion of the TIV and a contact pad on the frontside of the first die; forming a second RDL structure over the frontside of the first die, the molding compound, and the TIV, the second RDL structure electrically connected to the contact pad of the first die; forming a first plurality of solder balls and an integrated passive device (IPD) on the second RDL structure; de-bonding the carrier from the first RDL structure to expose a surface of the first RDL structure; forming an enhancement layer on the exposed surface of the first RDL structure; forming a cascaded opening through the enhancement layer; forming and disposing a pre-solder bump into the cascaded opening, the pre-solder bump electrically connected to the first RDL structure; and forming a three-dimensional (3D) pattern on the enhancement layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package structure, comprising:
a die having a frontside and a backside;
a first redistribution layer (RDL) structure disposed on and in contact with the backside of the die;
a second RDL structure disposed on, in contact with, and electrically connected to the frontside of the die;
a through integrated fan-out via (TIV) disposed lateral to the die and extending to electrically connect the first and the second RDL structures;
a molding compound disposed between the first and second RDL structures;
an enhancement layer disposed on the first RDL structure, the enhancement layer comprising a plurality of cascaded openings, wherein each one of the cascaded openings comprises:
a primary opening defined by a first side wall and a bottom wall; and
a secondary opening extended from the bottom wall of the primary opening to the first RDL structure, wherein the secondary opening is smaller in critical dimension than the corresponding primary opening,
a plurality of pre-solder bumps electrically connected to the first RDL structure, each pre-solder bump disposed in one of the cascaded openings, in contact with an uppermost redistribution layer of the first RDL structure, and horizontally aligned with the secondary opening thereof, and a plurality of solder balls disposed on and electrically connected to the second RDL structure.

2. The semiconductor package structure of claim 1, wherein the primary opening has a critical dimension of opening and a critical dimension of bottom, the secondary opening has a critical dimension of opening and a critical dimension of bottom, and wherein the critical dimension of opening of the secondary opening is smaller than the critical dimension of bottom of the primary opening.

3. The semiconductor package structure of claim 1, wherein the first side wall has a first angle of 120° or more relative to the bottom wall.

4. The semiconductor package structure of claim 1, wherein the secondary opening is defined by a second side wall that has a second angle of 120° or more relative to the first RDL structure.

5. The semiconductor package structure of claim 1, wherein the primary opening has a first depth measured from an outer surface of the enhancement layer to the bottom wall, wherein the first depth is less than a thickness of the enhancement layer.

6. The semiconductor package structure of claim 5, wherein the secondary opening has a second depth measured from the bottom wall to the first RDL structure, and a ratio of the first depth to the second depth is at least 4.

7. The semiconductor package structure of claim 1, wherein the cascaded openings are formed by laser drilling, etching, photolithography, or combinations thereof.

8. The semiconductor package structure of claim 1, wherein the enhancement layer has a thickness in a range from 10 μm to 100 μm.

9. The semiconductor package structure of claim 1, wherein the enhancement layer further comprises a laser marking region surrounded by the plurality of pre-solder bumps.

10. The semiconductor package structure of claim 9, wherein the laser marking region comprises a three-dimensional (3D) pattern having a plurality of recesses.

11. The semiconductor package structure of claim 10, wherein the plurality of recesses have an average recess depth 50% or less relative to a thickness of the enhancement layer.

12. The semiconductor package structure of claim 10, wherein the 3D pattern carries identification information.

13. The semiconductor package structure of claim 1, further comprising an integrated passive device disposed on and electrically connected to the second RDL structure.

14. A semiconductor package structure, comprising:
a first die having a frontside and a backside;
a first redistribution layer (RDL) structure disposed on and in contact with the backside of the first die;
a second RDL structure disposed on, in contact with, and electrically connected to the frontside of the first die;
a through integrated fan-out via (TIV) disposed lateral to the first die and extending to electrically connect the first and the second RDL structures;
a molding compound disposed between the first and second RDL structures;
an enhancement layer disposed on the first RDL structure, the enhancement layer comprising a plurality of cascaded openings, wherein each one of the cascaded openings comprises:
a primary opening defined by a first side wall and a bottom wall; and
a secondary opening extended from the bottom wall of the primary opening to the first RDL structure, wherein the secondary opening is smaller in critical dimension than the corresponding primary opening,
a plurality of pre-solder bumps electrically connected to the first RDL structure, each pre-solder bump disposed in one of the cascaded openings, in contact with an uppermost redistribution layer of the first RDL structure, and horizontally aligned with the secondary opening thereof,
a printed circuit board (PCB) electrically connected to the first die through a first plurality of solder balls disposed between the second RDL structure and the PCB; and
a second die electrically connected to the first RDL structure through a second plurality of solder balls, each of the second plurality of solder balls disposed in one of the cascaded openings and electrically connected to the corresponding pre-solder bump therein.

15. The semiconductor package structure of claim 14, further comprising an underfill disposed between the second die and the enhancement layer and between the PCB and the first RDL structure.

16. The semiconductor package structure of claim 14, wherein the enhancement layer further comprises a three-dimensional (3D) pattern configured to facilitate flow of an underfill between the second die and the enhancement layer.

17. The semiconductor package structure of claim 14, wherein the second die is dynamic random access memory (DRAM).

18. A method of fabricating a semiconductor package structure, the method comprising:
providing a carrier;
forming a first redistribution layer (RDL) structure on the carrier;
forming a through integrated fan-out via (TIV), the TIV disposed on and electrically connected to the first RDL structure;
disposing a first die onto the first RDL structure, the first die having a frontside and a backside, wherein the backside is in contact with the first RDL structure;
disposing a molding compound over the first RDL structure to encapsulate the first die and the TIV;
performing grinding to expose a portion of the TIV and a contact pad on the frontside of the first die;
forming a second RDL structure over the frontside of the first die, the molding compound, and the TIV, the second RDL structure in contact with and electrically connected to the contact pad of the first die;
forming a first plurality of solder balls and an integrated passive device (IPD) on the second RDL structure;
de-bonding the carrier from the first RDL structure to expose a surface of the first RDL structure;
forming an enhancement layer on the exposed surface of the first RDL structure;
forming a cascaded opening through the enhancement layer; and
forming and disposing a pre-solder bump into the cascaded opening, the pre-solder bump electrically connected to the first RDL structure, wherein the pre-solder bump is in contact with an uppermost distribution layer of the first RDL structure.

19. The method of claim 18, wherein forming the cascaded opening further comprises:
forming a primary opening, the primary opening defined by a first side wall and a bottom wall; and forming a secondary opening, the secondary opening extended from the bottom wall of the primary opening to the first RDL structure, wherein the secondary opening is smaller in critical dimension than the corresponding primary opening.

20. The method of claim 18, wherein the cascaded opening comprises a plurality of cascaded openings, the method further comprising:

performing surface mount technology (SMT) to bond a second die to the first RDL structure through a plurality of solder balls, wherein each of the solder balls is disposed in one of the plurality of cascaded openings and jointed with the corresponding pre-solder bump therein; and injecting an underfill to the semiconductor package structure.

* * * * *